US006492212B1

(12) United States Patent
Ieong et al.

(10) Patent No.: US 6,492,212 B1
(45) Date of Patent: Dec. 10, 2002

(54) VARIABLE THRESHOLD VOLTAGE DOUBLE GATED TRANSISTORS AND METHOD OF FABRICATION

(75) Inventors: MeiKei Ieong, Wappingers Falls, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/972,172

(22) Filed: Oct. 5, 2001

(51) Int. Cl.[7] .................. H01L 21/0084; H01L 21/336; H01L 21/3205; H01L 21/4763
(52) U.S. Cl. ...................... 438/157; 438/283; 438/286; 438/291; 438/585
(58) Field of Search .................. 438/157, 283, 438/286, 149, 291, 585

(56) References Cited

U.S. PATENT DOCUMENTS

| | | | |
|---|---|---|---|
| 3,872,491 A | | 3/1975 | Hanson et al. |
| 5,420,048 A | * | 5/1995 | Kondo |
| 5,563,093 A | | 10/1996 | Koda et al. |
| 5,670,397 A | | 9/1997 | Chang et al. |
| 5,780,330 A | | 7/1998 | Choi |
| 5,793,082 A | | 8/1998 | Bryant |
| 5,877,535 A | | 3/1999 | Matsumoto |
| 5,882,964 A | | 3/1999 | Schwalke |
| 5,902,121 A | | 5/1999 | Goto |
| 5,933,721 A | | 8/1999 | Hause et al. |
| 5,939,937 A | | 8/1999 | Terletzki |
| 6,004,837 A | * | 12/1999 | Gambino et al. ........... 438/157 |
| 6,015,991 A | | 1/2000 | Wheeler et al. |
| 6,300,182 B1 | * | 10/2001 | Yu ............................. 438/217 |
| 6,372,559 B1 | * | 4/2002 | Crowder et al. ............ 438/157 |
| 6,396,108 B1 | * | 5/2002 | Krivokapic et al. ........ 257/365 |

OTHER PUBLICATIONS

Long et al. "Dual–Material Gate (DMG) Field Effect Transistor", May 1999, IEEE Transactions on electron devices, vol. 46, No. 5, pp. 865–870.*
Chang et al. "Gate length scaling and threshold voltage control of double-gate MOSFETs", 2000 IEEE, pp. 31.2.1/ 719–31.2.4/722.*
Long et al. Dual material gate field effect transistor (DMG-FET), 1997 IEEE, pp. 21.2.1/549–21.2.4/552.*
"Ultrafast Low–Power Operation of $p^+$–$n^+$ Double–Gate SOI Mosfets," Tanaka, et al., 1994 Symposium on VLSI Technology Digest of Technical Papers, pp. 11–12.
"Comparison of Short–Channel Effect and Offstate Leakage in Symmetric vs. Asymmetric Double Gate MOSFETs", Tang, et al., 2000 IEEE Internatinal SOI Conference, Oct. 2000, p. 120.
"Sub 50–nm FinFET: PMOS", Huang, et al., 0–7803–5413–3/99, Department of Electrical Engineering and Computer Sciences, University of California.

* cited by examiner

Primary Examiner—John F. Niebling
Assistant Examiner—Ron Pompey
(74) Attorney, Agent, or Firm—Schmeiser, Olsen & Watts

(57) ABSTRACT

The present invention provides a double gate transistor and a method for forming the same that facilitates the formation of different transistors having different threshold voltages. The embodiments of the present invention form transistors having different body widths. By forming double gate transistors with different body widths, the preferred embodiment forms double gate transistors that have different threshold voltages, without adding excessive process complexity. The preferred embodiment of the present invention is implemented using a fin type double gated structure. In a fin type structure, the double gates are formed on each side of the body, with the body being disposed horizontally between the gates.

11 Claims, 31 Drawing Sheets

VARIABLE THRESHOLD VOLTAGE DOUBLE GATED TRANSISTORS AND METHOD OF FABRICATION

BACKGROUND OF THE INVENTION

1. Technical Field

The present invention relates generally to the field of semiconductor manufacturing and, more specifically, to a method for forming double gated field effect transistors.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.) One of the fundamental parameters of FET design is the threshold voltage (Vt). The threshold voltage of a FET is generally defined as the gate voltage required to switch the transistor on or off (depending upon the type of FET). FETs with different threshold voltages have different operational characteristics. For example, transistors with lower threshold voltage generally can operate at higher operational frequency, and have a higher current drive. However, transistors with lower threshold voltage also have higher leakage current, and thus generally use more power than transistors with higher threshold voltages.

Thus, in some applications it is generally desirable to have transistors with lower threshold voltages to improve performance, while in other applications it is generally desirable to have transistors with higher threshold voltage to reduce unwanted power consumption. Unfortunately, it is generally difficult to make transistors with different threshold voltage on the same device when the transistors employ ultra-thin bodies.

This is especially true of double gated field effect transistors. Double gated FETs use two gates, one on each side of the body, to facilitate scaling of CMOS dimensions while maintaining an acceptable performance. In particular, the use of the double gate increases the control of the gate on the channel potential, which allows the transistor to have better current control, without increasing the gate length of the device. As such, the double gated FET is able to have the current control of a larger transistor without requiring the device space of the larger transistor.

Thus, there is a need for improved device structures and methods of fabrication of double gated transistors that provide transistors having different threshold voltages on the same device without overly increasing fabrication complexity.

DISCLOSURE OF INVENTION

Accordingly, the present invention provides a double gate transistor and a method for forming the same that facilitates the formation of different transistors having different threshold voltages. In a first aspect, the invention is a method for forming a plurality of transistors having different threshold voltages, the method comprising the steps of:

a) providing a semiconductor substrate;

b) forming a plurality of shapes on the semiconductor substrate, each of the plurality of shapes having a width;

c) selectively adjusting the widths of at least one selected shapes;

d) patterning the semiconductor substrate using the plurality of shapes to form a plurality of transistor bodies such that the width of each the plurality of transistor bodies is at least partially determined by the width of a corresponding one of the plurality of shapes;

e) providing a first gate structure of a first work-function adjacent a first body edge of each of the plurality of transistor bodies; and f) providing a second gate structure of a second work-function adjacent a second body edge of each of the plurality of transistor bodies.

In a second aspect, the invention is a plurality of transistors comprising:

a) a plurality of transistor bodies formed on a substrate, the transistor bodies each having a first vertical edge and a second vertical edge defining a transistor body width, wherein a selected portion of the plurality of transistor bodies has an adjusted width;

b) a plurality of first gate structures, each of the plurality of first gate structures adjacent to one of the plurality of transistor body first vertical edges, the plurality of first gate structures having a first work-function; and c) a plurality of second gate structures, each of the plurality of second gate structures adjacent to one of the plurality of transistor body second vertical edges, the plurality of second gate structures having a second work-function.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

Accordingly, the present invention provides a double gate transistor and a method for forming the same that facilitates the formation of different transistors having different threshold voltages. The embodiments of the present invention form transistors having different body widths. By forming double gate transistors with different body widths, the preferred embodiment forms double gate transistors that have different threshold voltages, without adding excessive process complexity.

In a first embodiment of the present invention, the double gates are formed on each side of a body disposed horizontally between the gates. This allows the gate length of the device to have minimum feature size, while allowing the thickness of the body to be much smaller than the gate length. This also improves control of the threshold voltage of the resulting device. Additionally, this method allows different transistors to be formed with different threshold voltages while minimizing process and device complexity.

Furthermore, the invention provides a double gate transistor with asymmetric gate doping, where one of the double gates is doped degenerately n-type and the other degenerately p-type. By doping one of the gates n-type, and the other p-type, the threshold voltage of the resulting device is improved. In particular, by asymeterically doping the two gates, the resulting transistor can, with adequate doping of the body, have a threshold voltage in a range that enables low-voltage CMOS operation. For example, a transistor can be created that has a threshold voltage between 0V and 0.5V for nFETs and between 0 and −0.5V for pFETs.

Various electrically conducting materials have associated with them a built-in electrical potential, often referred to as a "work-function," which, along with externally applied voltage, determines the relative affinity of the conductor for electrons (or holes). In a metal, the work-function is intrinsic to the material, while in a semiconductor, such as silicon, this work-function can be adjusted to values between the valence band and conduction band by introduction of impurities which supply excess holes or electrons. In the asymmetric double gated FET of the preferred embodiment, the two gate electrodes are doped with impurities of opposite polarity, with one gate being doped n-type and the other gate being doped p-type. Thus, the two gate electrodes have different work-functions and hence one gate electrode (the strong gate, the n-gate for nFETs) has a greater affinity for the inversion carriers while the other electrode (the weak gate, the p-gate for nFETs) has a lesser affinity for the inversion carriers. As a result the inversion channel will form in the semiconductor body at a location nearer the 'strong' gate, and thus results both gate electrodes contributing to the inversion potential leading to a relatively low threshold voltage (e.g, between 0 and 0.5 volts).

Figure 1:
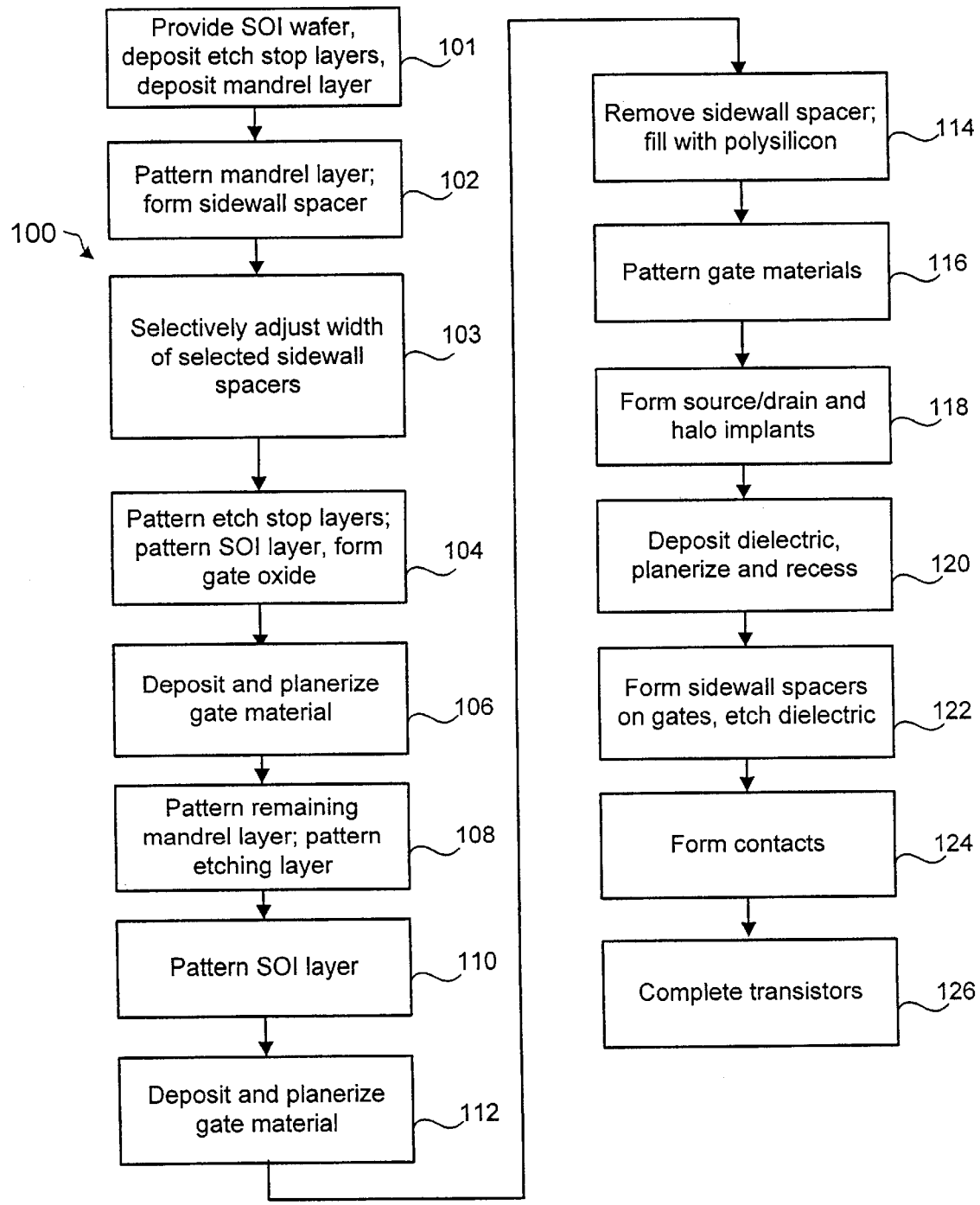
FIG. 1 is a flow diagram illustrating a first fabrication method.

Turning now to FIG. 1, a method 100 for forming a double gated transistor in accordance with the preferred embodiment is illustrated. Method 100 forms a double gated transistor in a way that improves the threshold voltage of the transistor, while maintaining fabrication reliability and simplicity. Additionally, method 100 facilitates the formation of double gate transistors with different body widths and thus different threshold voltages. In particular, method 100 uses sidewall spacers to define the width of the body of the transistor (sometimes referred to as the "fin width"). In method 100, the sidewall spacers are selectively modified to facilitate the selective modification of threshold voltage of various transistors. Thus, method 100 can result in the formation of different transistors having different threshold voltages, with minimal processing complexity.

The first step 101 of method 100 is to provide an appropriate semiconductor wafer, deposit various etch stop layers, and deposit a mandrel layer. In the preferred embodiment, the wafer used comprises a silicon on insulator (SOI) wafer. As such, the wafer comprises a buried oxide layer beneath an SOI layer. As will be come clear the SOI layer is used to form the body of the double gated transistor. It is generally preferable to use a SOI layer that has a p-type (for NFETs) doping density in the range of $3 \times 10^{18}$ cm$^{-3}$ to $8 \times 10^{18}$ cm$^{-3}$ to provide proper centering and control of the threshold voltage of the transistor. However, in another embodiment to be described later, the doping of the SOI layer is done with an angled implant to facilitate the achievement of a uniform concentration density throughout the body.

However, non-SOI wafers can be used. When a non-SOI wafer is used, the processing remains otherwise identical to those of the SOI wafer case, except as noted.

With a SOI wafer provided, three etch stop layers are formed on the wafer, preferably comprising a silicon dioxide layer, a silicon nitride layer, and a second silicon oxide layer. These etch stop layers will be used throughout the fabrication process when an appropriate etch stop is needed.

Next, a mandrel layer is formed. The mandrel layer preferably comprises a layer of oxide or other suitable material. As will be explained in greater detail later, the mandrel layer is as part of a sidewall image transfer which is used to define the body of the double gated transistor. As such, the mandrel layer is used to form a sidewall spacer, which is in turn used to define the transistor body. In the preferred embodiment, the mandrel layer has a thickness of between 10 nm and 100 nm, however, such a thickness may change depending on the desired body thickness.

Figure 2:
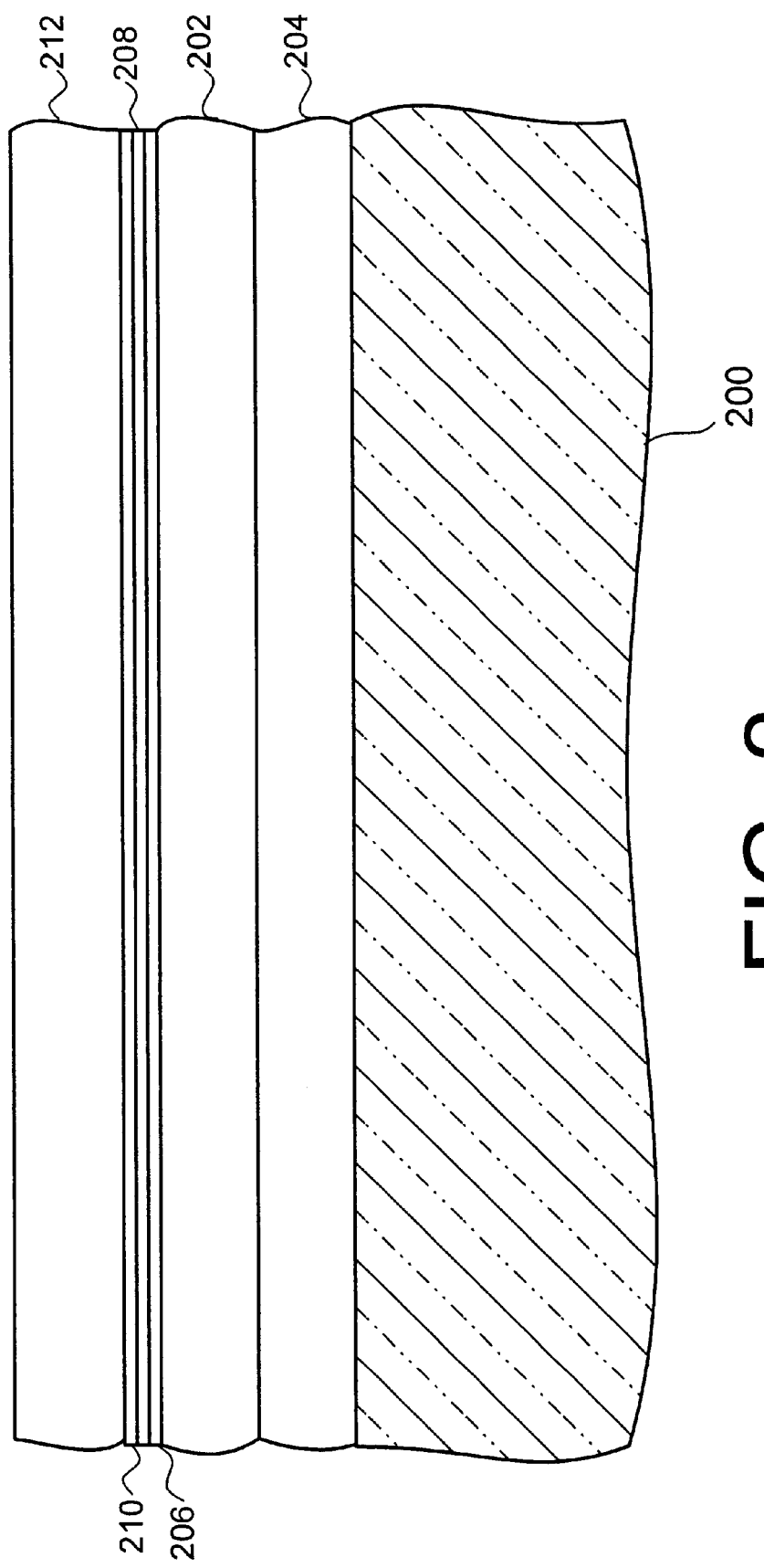
FIGS. 2–13 are cross-sectional side views of an exemplary double gated transistor during fabrication.

Turning now to FIG. 2, a wafer portion 200 is illustrated after the formation of etch stop layers and a mandrel layer. The preferred embodiment wafer portion 200 comprises an SOI wafer, and as such includes an SOI layer 202 and a buried oxide layer 204. On top of the SOI layer is formed a oxide layer 206, a nitride layer 208, and a oxide layer 210. These layers serve as etch stop layers. On top of oxide layer 210 is formed a mandrel layer 212.

Returning to FIG. 1, the next step 102 is to pattern the mandrel layer and form sidewall spacers. The mandrel layer is pattered to open that area in which the one of the double gates is formed. The sidewall spacer is preferably formed using a deposition of silicon nitride, followed by a suitable directional etch. Of course, other materials and methods can be used for forming the sidewall spacer. As will be shown later the thickness of sidewall spacer will define the body region of the double gated transistor using sidewall image transfer. This thickness will be selectively adjusted to allow for the formation of transistors with different threshold voltages.

Figure 3:
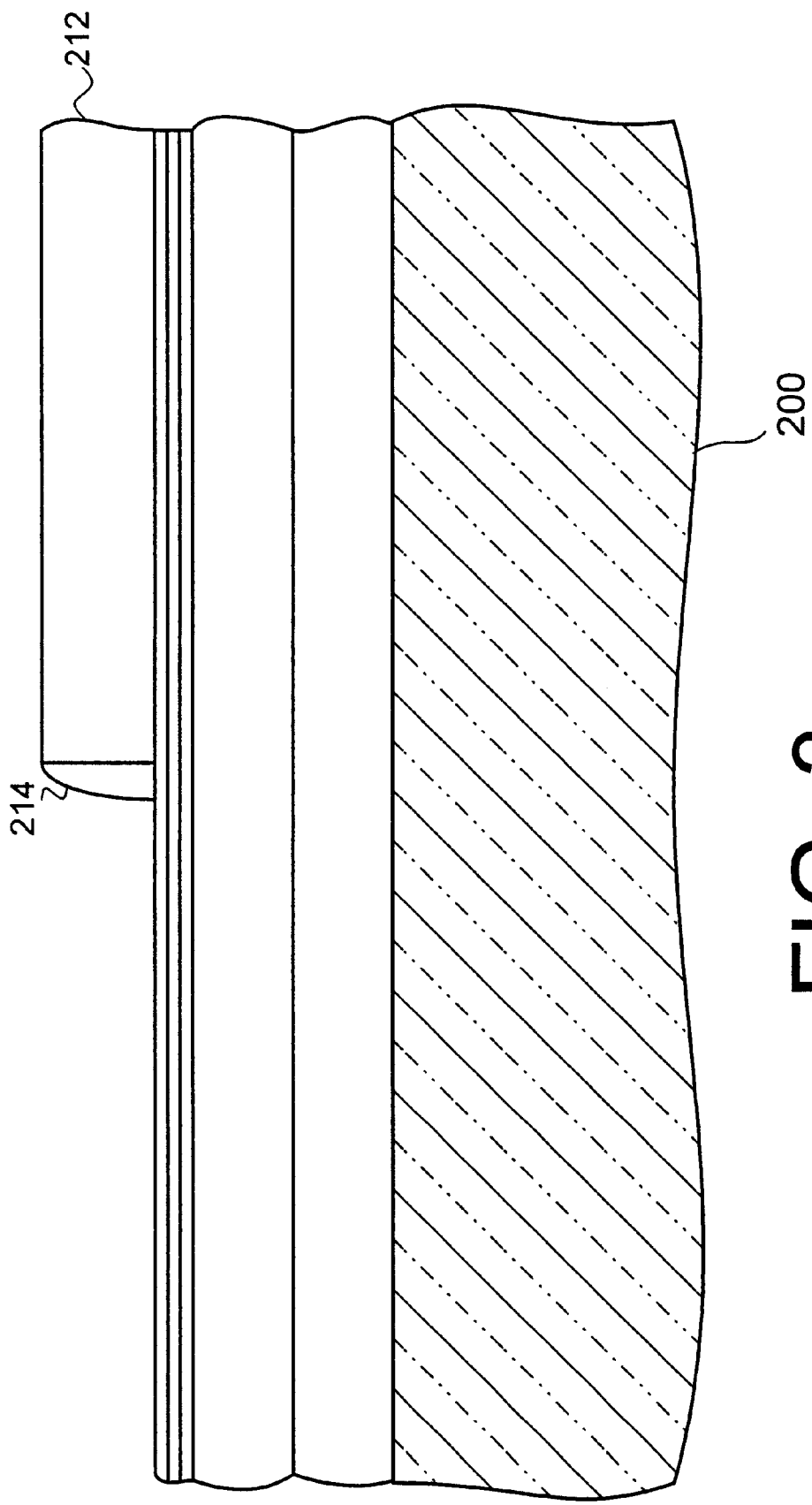

Turning to FIG. 3, the wafer portion 200 is illustrated after the mandrel layer 212 has been patterned and a sidewall spacer 214 has been formed. Again, the sidewall spacer will be used to define the body thickness of the resulting transistor using sidewall image transfer.

Returning to FIG. 1, the next step 103 is to selectively adjust the width of selected sidewall spacers. Since the width of the sidewall spacer determines the body width which in turn effects the threshold voltage of the resulting transistor, step 103 allows the threshold voltage of selected transistors to be easily adjusted. The width of the sidewall spacers can be adjusted in any suitable manner. For example, they can be can covered with a suitable protective layer, with the protective layer then being patterned to exposed selected sidewall spacers. For example, a suitable photoresist layer can be deposited and patterned to expose only selected sidewall spacers. The width of the exposed sidewall spacers can then adjusted. For example, an isotropic etch of short duration can be used that results in narrowing of only the exposed sidewall spacers, with unexposed sidewall spacers remaining unchanged. Any isotropic etch which removes a portion of the exposed sidewall spacers while not significantly removing oxide is suitable for this step.

Figure 4:
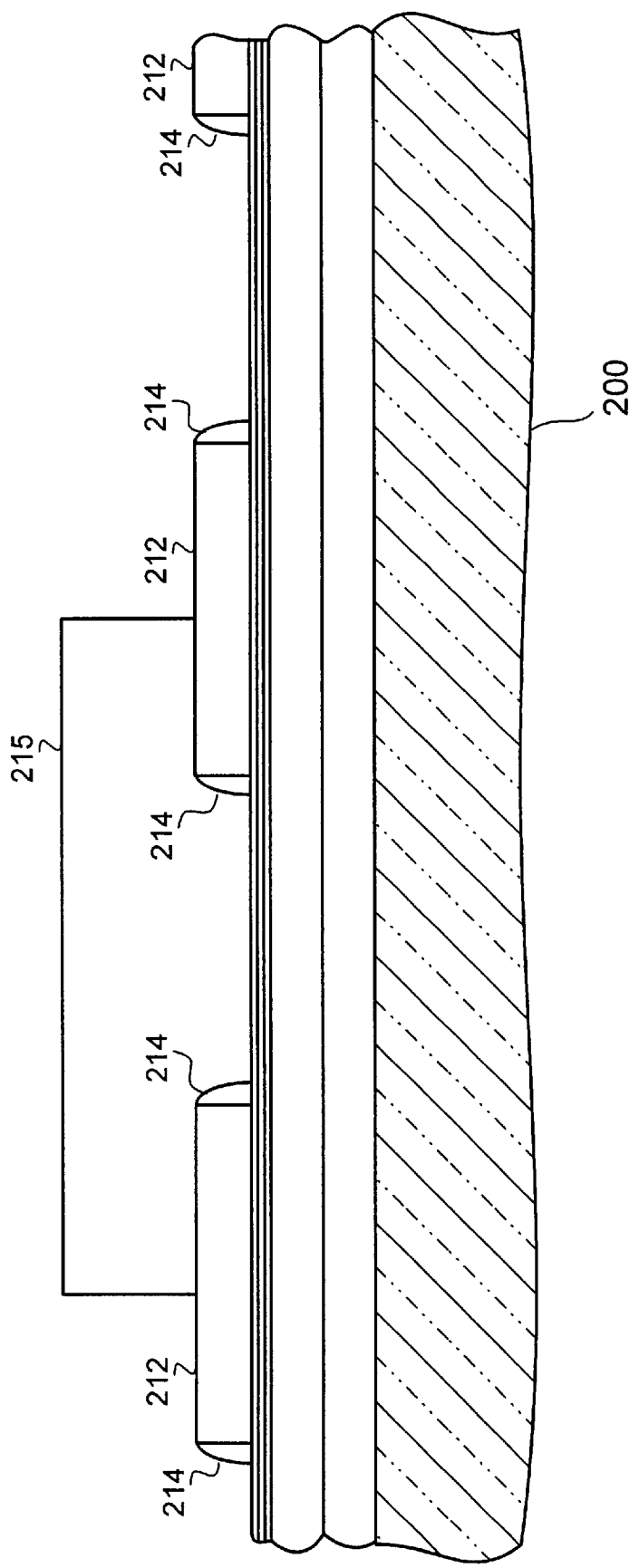

Turning now to FIG. 4, a larger area of wafer portion 200 is illustrated that shows a plurality of sidewall spacers 214 formed on the exposed edges of mandrel layer 212. Each of the sidewall spacers 214 will be used to define a transistor body for a double gate field effect transistor. In accordance with method 100, a layer of photoresist 215 has been deposited and patterned to expose selected sidewall spacers 214 while other sidewall spacers remain covered by the photoresist 214. This allows the width of the exposed sidewall spacers 214 to be adjusted relative to the width of the unexposed sidewall spacers 214. For example, by performing an isotropic etch that selectively narrows only the exposed sidewall spacers 214.

Figure 5:
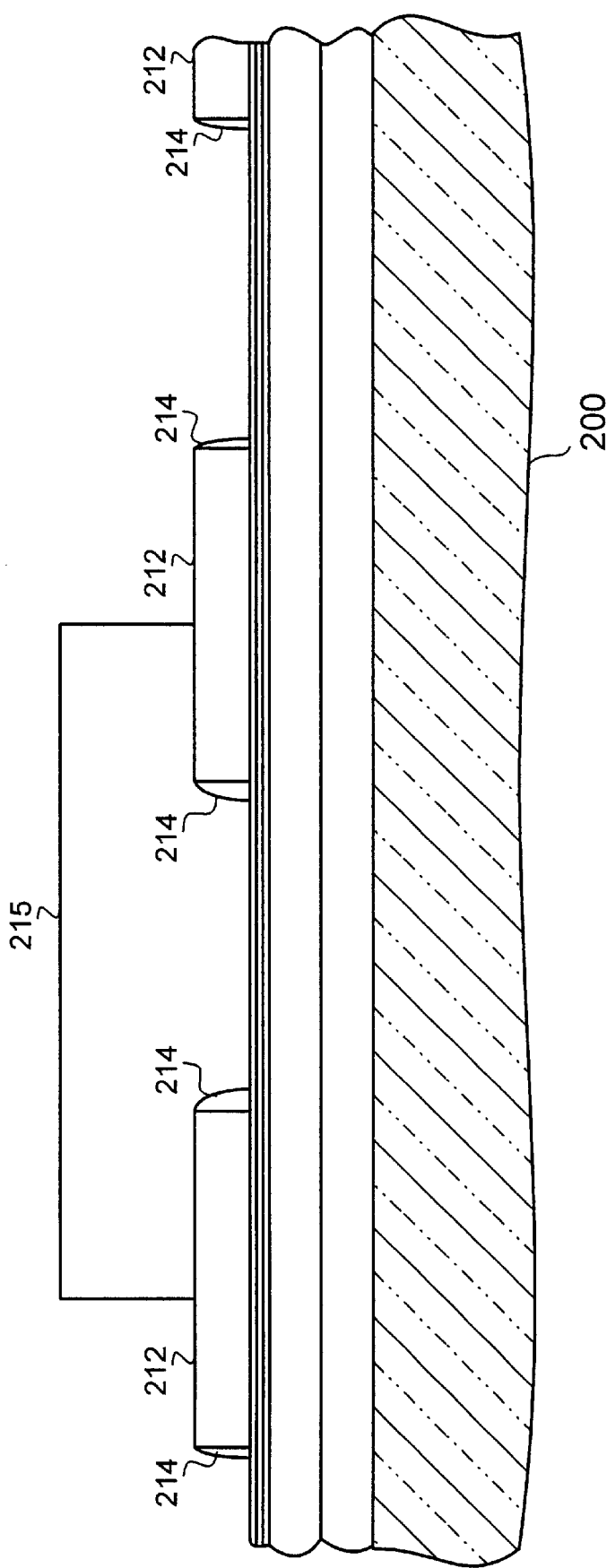

Turning now to FIG. 5, the larger area of wafer portion 214 is illustrated after the exposed sidewall spacers 214 have been narrowed using a suitable etch. Again, as will become clear, the width of the sidewall spacer ultimately determines the body width and hence the threshold voltage of the resulting transistors. Thus, transistors made using narrowed sidewall spacers will have a narrower body than those made with non-narrowed sidewall spacers. The transistors with a narrowed body will have a higher threshold voltage relative to the those with the non-narrowed body.

Steps 104 through 114 will now be described and illustrated with only one transistor body, but it will be understood that the same steps will be applied to both narrowed and non-narrowed transistors.

Returning to FIG. 1, after removing the remaining photo resist, the next step 104 is to pattern etch stop layers and patterning the SOI layer using the sidewall spacer and remaining mandrel material as a mask, and to form gate oxide on the exposed side of the SOI layer. This is preferably done using a suitable reactive ion etch. The gate oxide is preferably formed by thermal oxidation, typically at 750–800° C. Also, during this step an implantation into the body of the transistor can be done. This would preferably comprise an angled implant into the exposed sidewall of the SOI layer, done before the formation of the gate oxide. This would serve to properly dope the body of the transistor. As will be described in greater detail below, this angled implant can performed in a way that achieves uniform concentration density to help compensate for threshold voltage variations.

Figure 6:
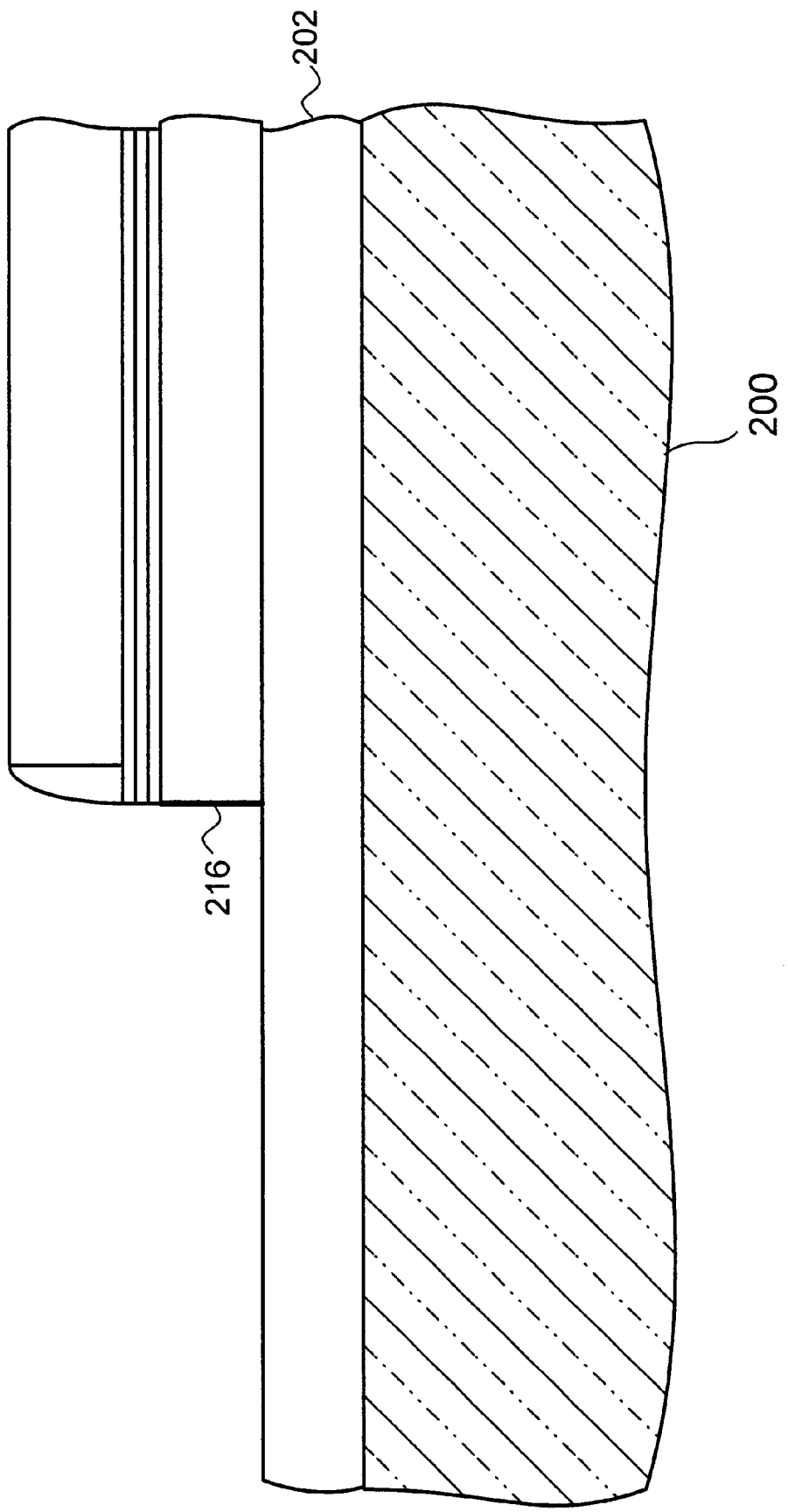

Turning now to FIG. 6, the wafer portion 200 is illustrated after the SOI layer 202 has been patterned and gate oxide 216 has been formed on the side of the SOI layer 202. Again, an angled body implant can also be performed before the formation of the gate oxide.

Figure 7:
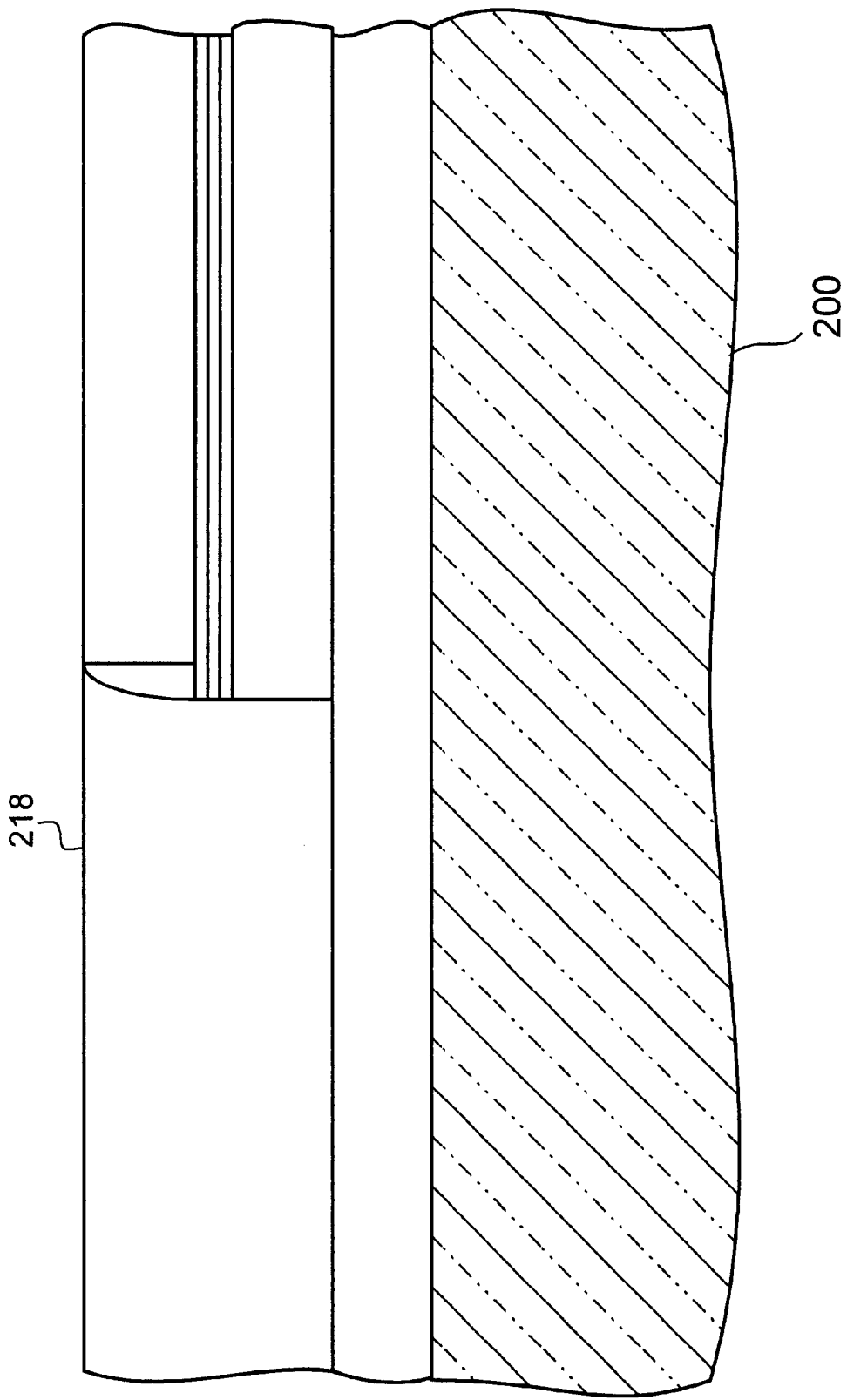

Returning to FIG. 1, the next step 106 is to deposit and planerize the gate material. As described above, in the preferred embodiment, the double gated transistor has one gate formed n+ and another gate formed p+. In the illustrated implementation, the n+ gate is formed first. Turning to FIG. 7, the wafer portion 200 is illustrated after n+ polysilicon 218 has been deposited and planarized. As will become clear, n+ polysilicon 218 will be used to form one of the gates in the preferred embodiment double gated transistor.

Figure 8:
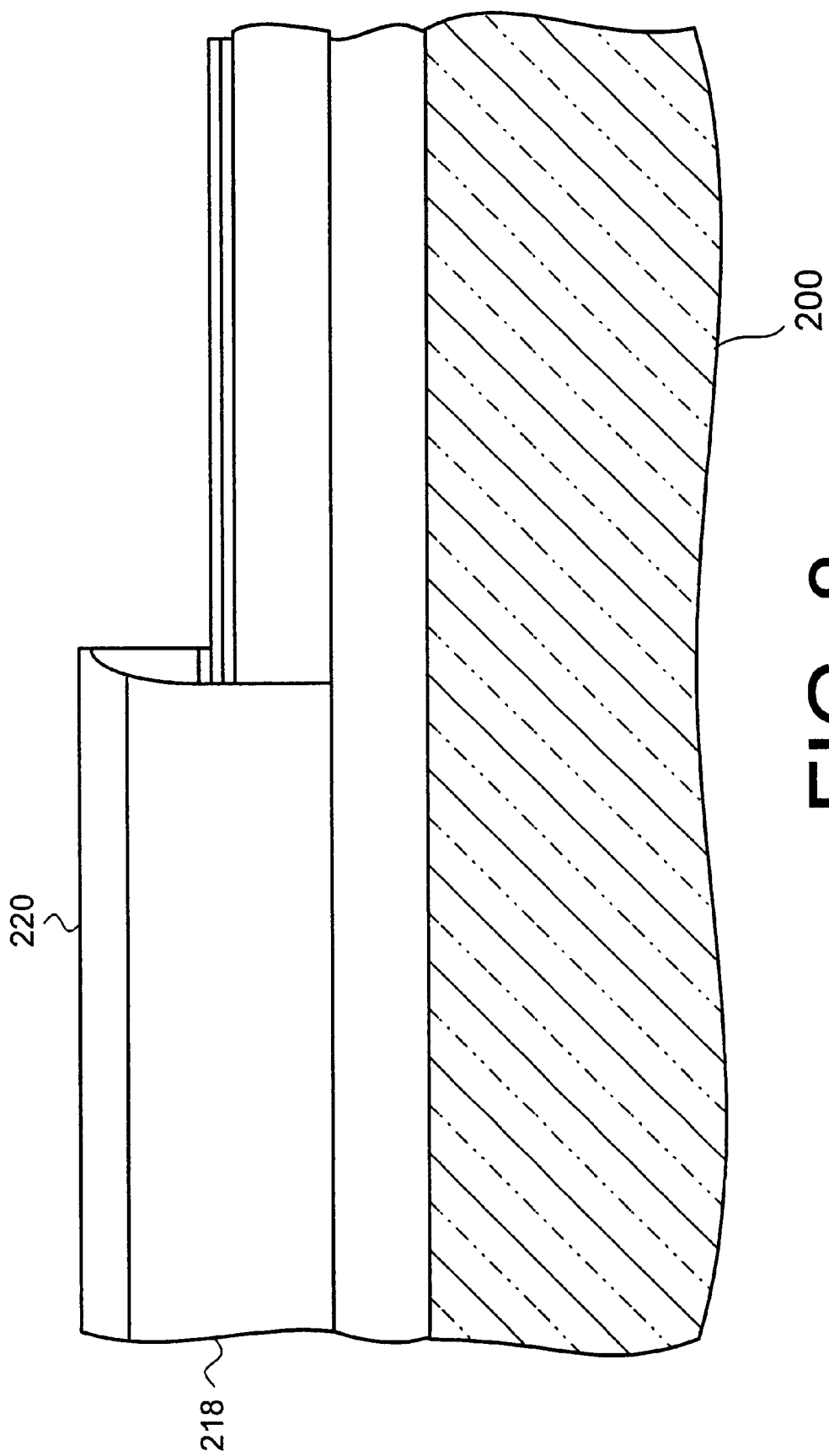

The next step 108 is to selectively remove the remaining mandrel layer. This is preferably done by performing a reactive ion etch of the mandrel selective to the nitride sidewall spacer, the nitride etch stop layer and the gate polysilicon. Then an intermediate oxide layer is formed on the polysilicon gate material, preferably by growing thermal oxide on the polysilicon gate. Turning now to FIG. 8, the wafer portion 200 is illustrated after the mandrel layer 212 has been removed, oxide etch stop layer 210 has been removed, and a thermal oxide layer 220 has been formed on the gate polysilicon 218. The nitride layer 208 that was beneath the remaining mandrel layer is etched selectively to the oxide 220 followed by a brief HF etch which removes the remaining oxide layer 206 which was beneath the remaining mandrel layer.

The next step 110 is to etch the exposed SOI layer. This is preferably done by using a reactive ion etch that etches the SOI layer, stopping on the buried oxide layer. This completes the patterning of the SOI layer to defines the thickness of the body of the double gated transistor. Then a gate oxide is formed on the exposed side of the transistor body.

Also, during this step another implantation into the body of the transistor can be performed. This would again preferably comprise an angled implant into the exposed sidewall of the SOI layer, done before the formation of the gate oxide.

Figure 9:
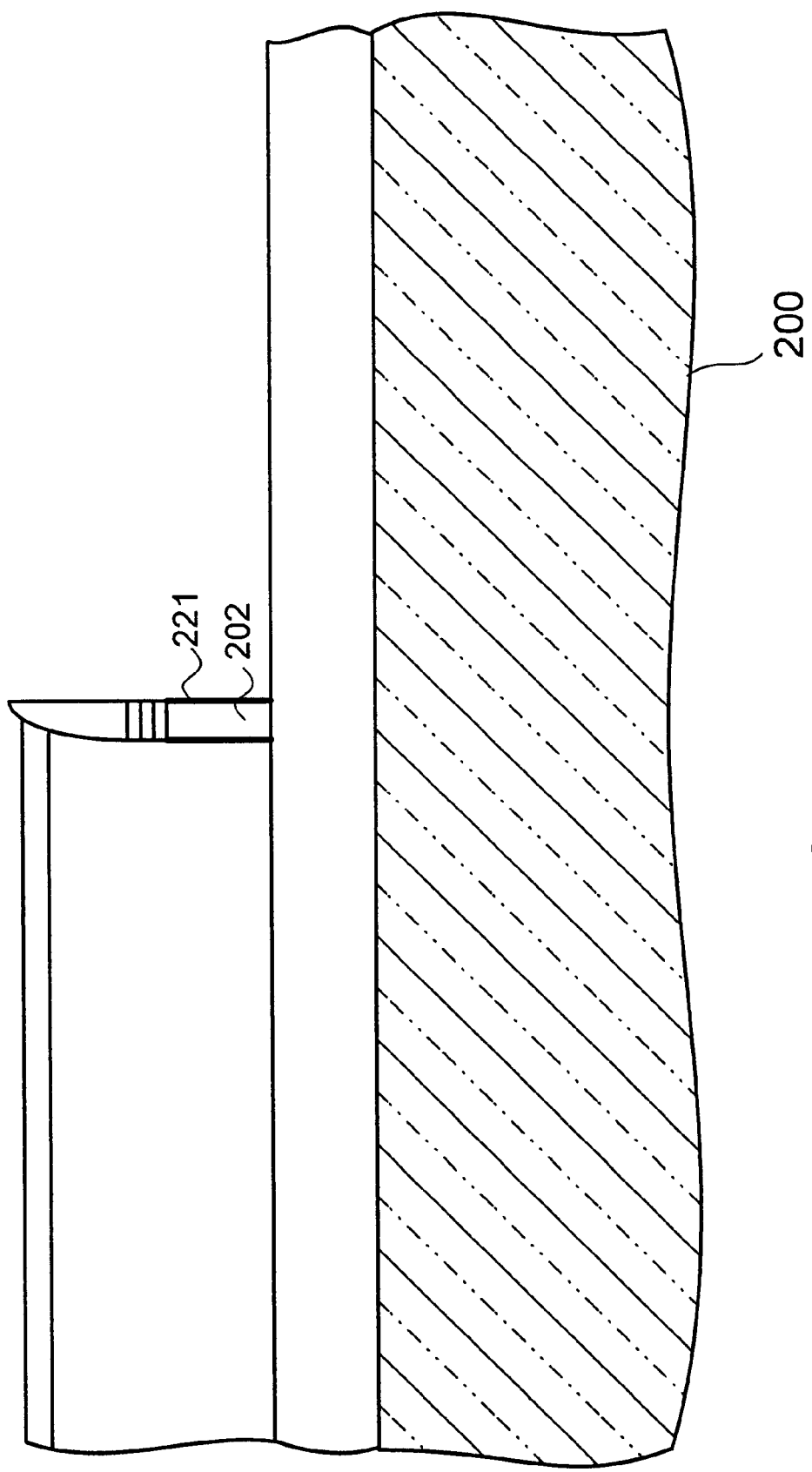

Turning to FIG. 9, the wafer portion 200 is illustrated after the patterning of the SOI layer 202. The remaining portion of SOI layer 202 comprises the body of the double gated transistor (in this case, a silicon fin). Gate oxide 221 is formed on the exposed SOI layer 202 using a thermal oxidation or by depositing a dielectric film.

When a non-SOI wafer is used, after the silicon fins are etched by time to the desired depth (typically 100–200 nm below the original silicon surface) a deposit/etch oxide process is used to deposit silicon dioxide exclusively on the bottom horizontal surfaces of the etched silicon of thickness approximately one-quarter the height of the etched fins. The oxide may be doped with boron in the case of nFETs or phosphorus in the case of pFETs and some portion of the dopant out diffused into those portions of the fins immediately adjacent to the doped oxide. This serves to suppress leakage in what will be ungated surfaces of the fins, from source to drain.

Returning to the SOI embodiment, it should be noted that the patterning of the SOI layer has defined the body of the double gated transistor. It is generally desirable to have the body thickness, illustrated as $T_{Si}$, narrow when compared to the gate length. Typically, the body thickness should be less than approximately one quarter of the gate length to give good threshold voltage control. Also, it is generally desirable that the body thickness should be greater than approximately 2.5 nm to avoid degraded mobility due to quantum confinement issues. As the gate length is generally made to minimum feature size, sidewall image transfer is used to achieve the subminimum feature size of the body. Thus, as illustrated and described above, the width of the sidewall spacer determines the body thickness.

Figure 10:
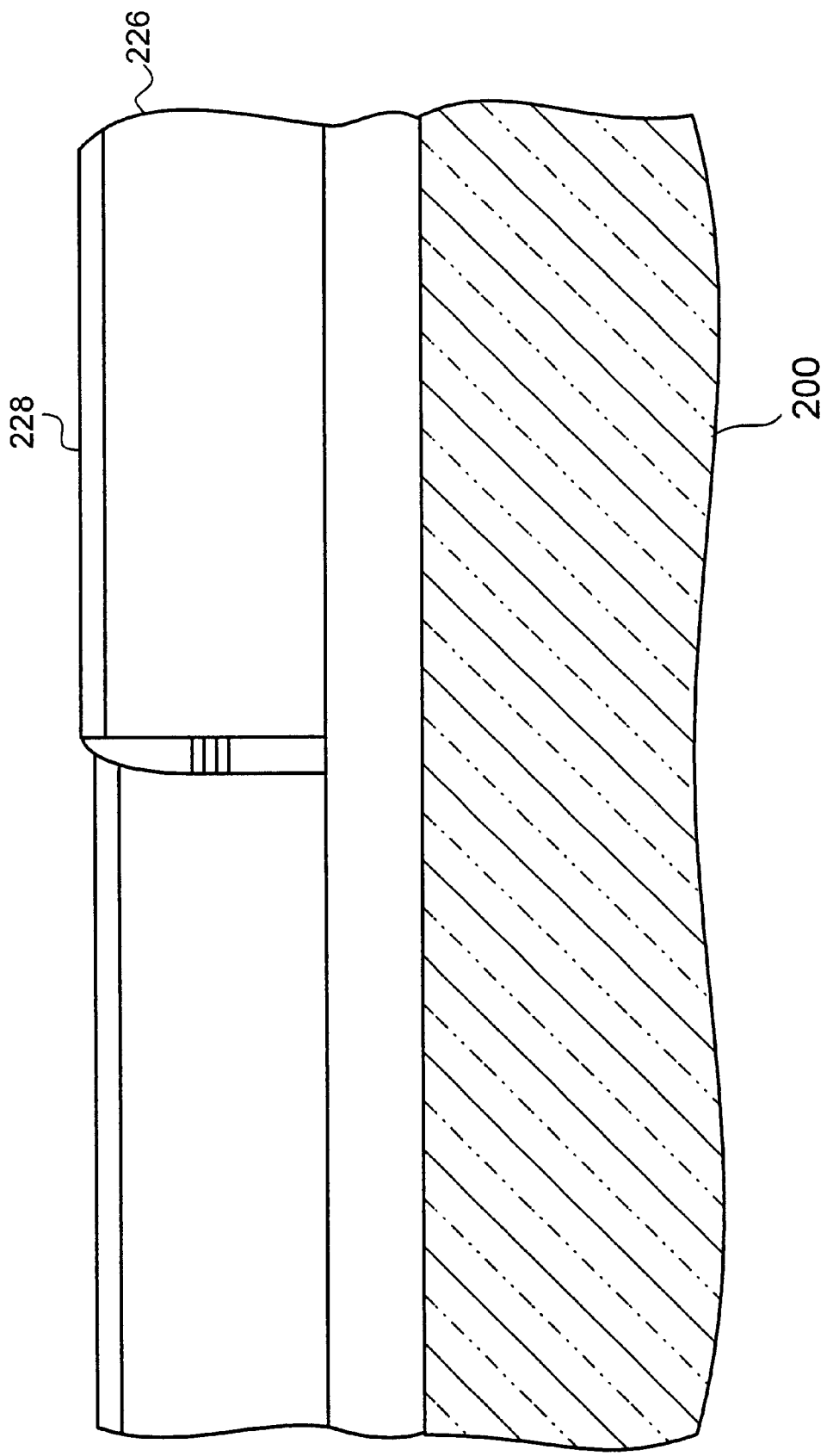

The next step 112 is to deposit and planerize the gate material for the second gate. As discussed above, the preferred embodiment uses gate material of opposite doping to form the two gates. Thus, the preferred embodiment uses p+ doped polysilicon to form the second of the two gates. The planarization of the p+ polysilicon gate material stops on the thermally grown oxide previously formed on the n+ polysilicon gate. After the planarization of the p+ polysilicon, a second layer of thermally grown oxide is formed. Turning now to FIG. 10, the wafer portion 200 is illustrated after the deposition and planarization of p+ doped polysilicon 226 to form the second gate. Thermally grown oxide 228 is then formed on the deposited polysilicon 226.

Figure 11:
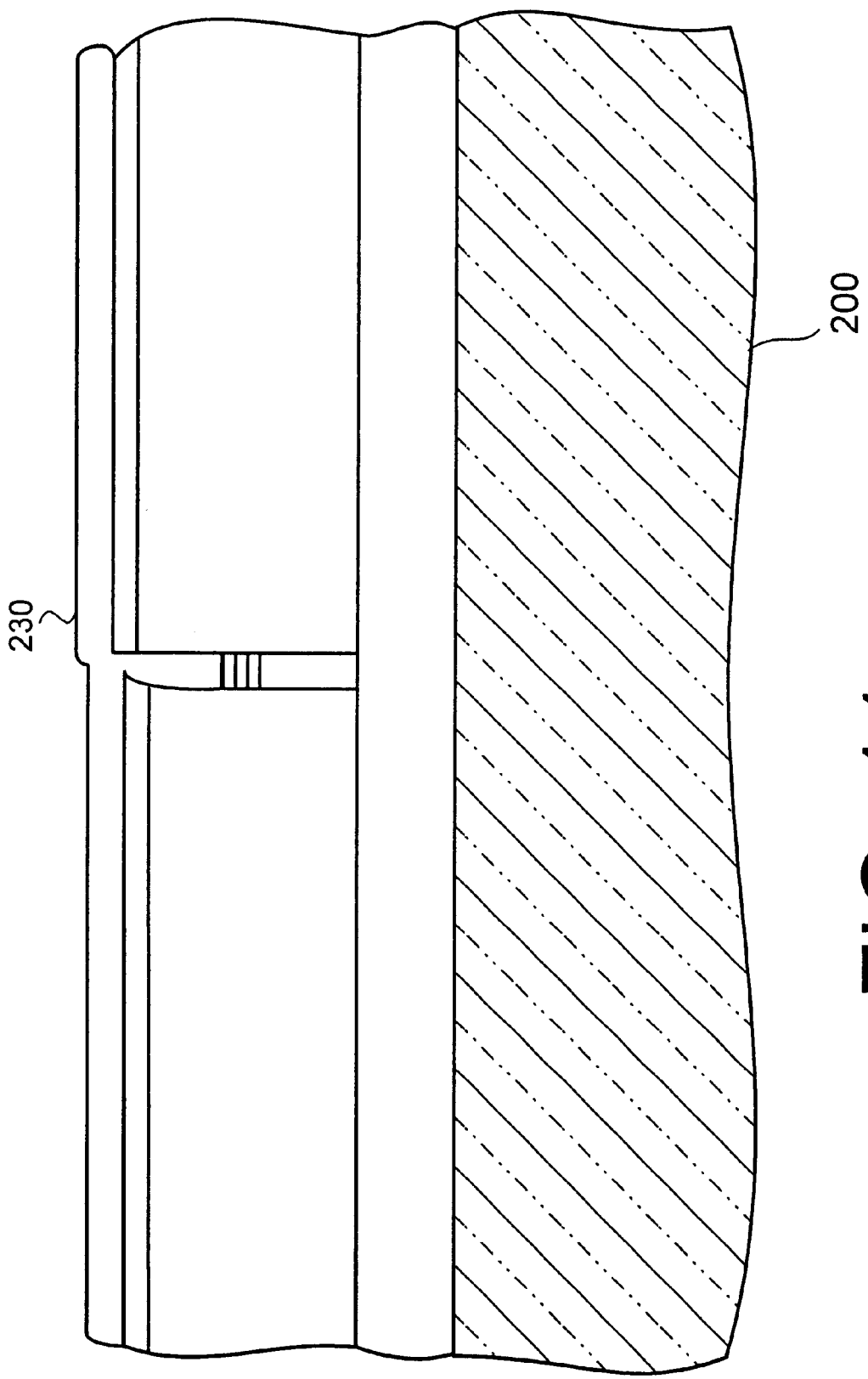
Figure 12:
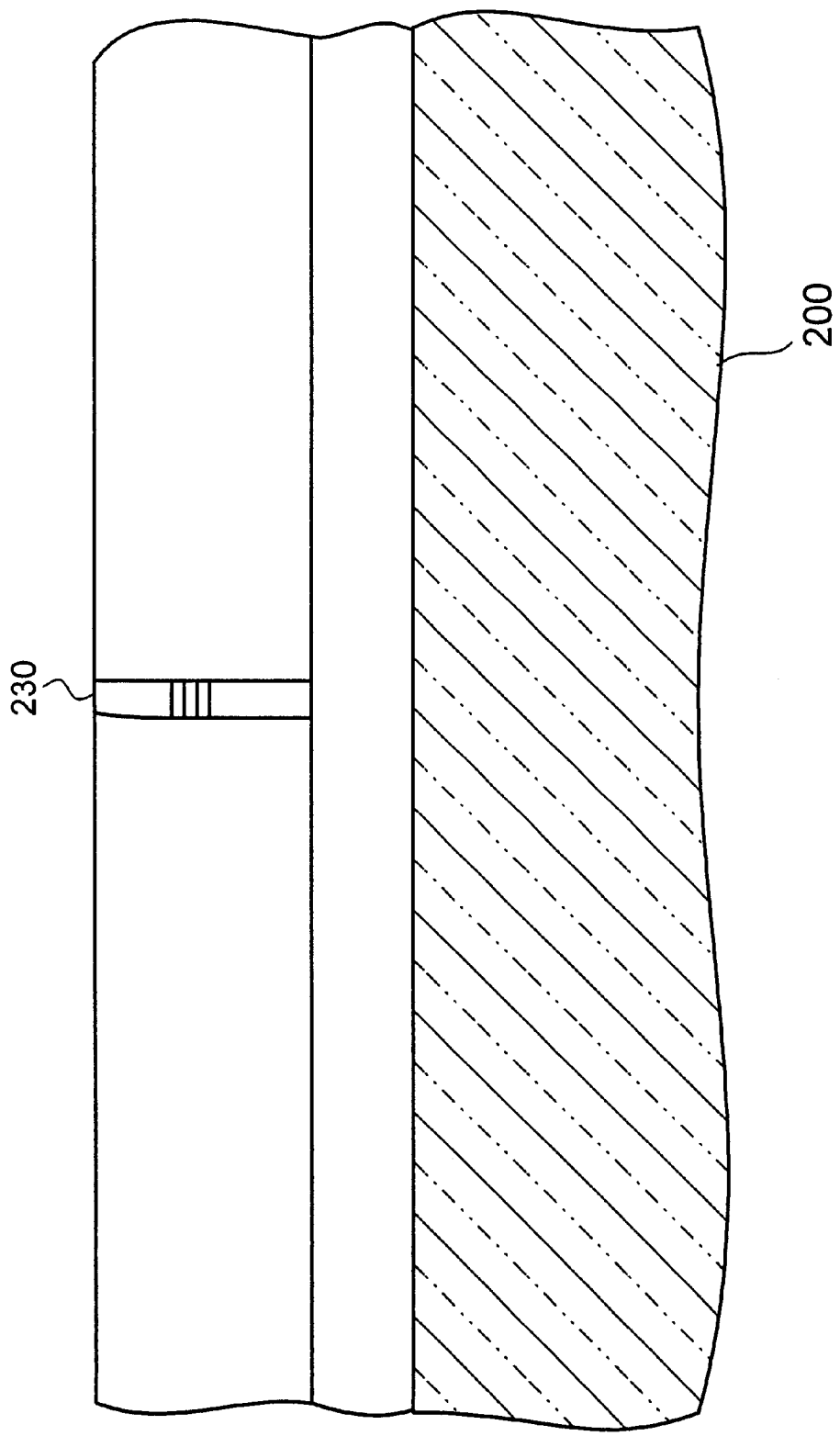

The next step 114 is to remove the sidewall spacer, and fill the sidewall spacer opening with intrinsic polysilicon, to maximize silicide formation in this region later on in the process. Optionally, the sidewall spacer may be left in place if the separate, independent gate contacts are desirable. The intrinsic polysilicon is then planarized using a CMP process that stops on the two layers of thermally grown oxide. This planarization process does not require high selectivity because there is very little excess intrinsic polysilicon to remove. The exposed thermally grown oxide on the two gates is then removed using a similar planarization process. Again, high selectivity is not required for this processing step. Turning now to FIG. 11, the wafer portion 200 is illustrated after the remaining portion of the sidewall spacer 214 has been removed, and then the space is filled with intrinsic polysilicon 230. FIG. 12 then illustrates the wafer portion 200 after the excess polysilicon 230 and thermally grown oxide 220 and 228 have been removed by CMP process. This leaves only a small portion of the intrinsic polysilicon 230 in the place of the originally formed sidewall spacer. This portion of intrinsic polysilicon 230 will be used to allow the formation of a silicide bridge connecting the p+ and n+ polysilicon gates later in the process flow.

Figure 13:
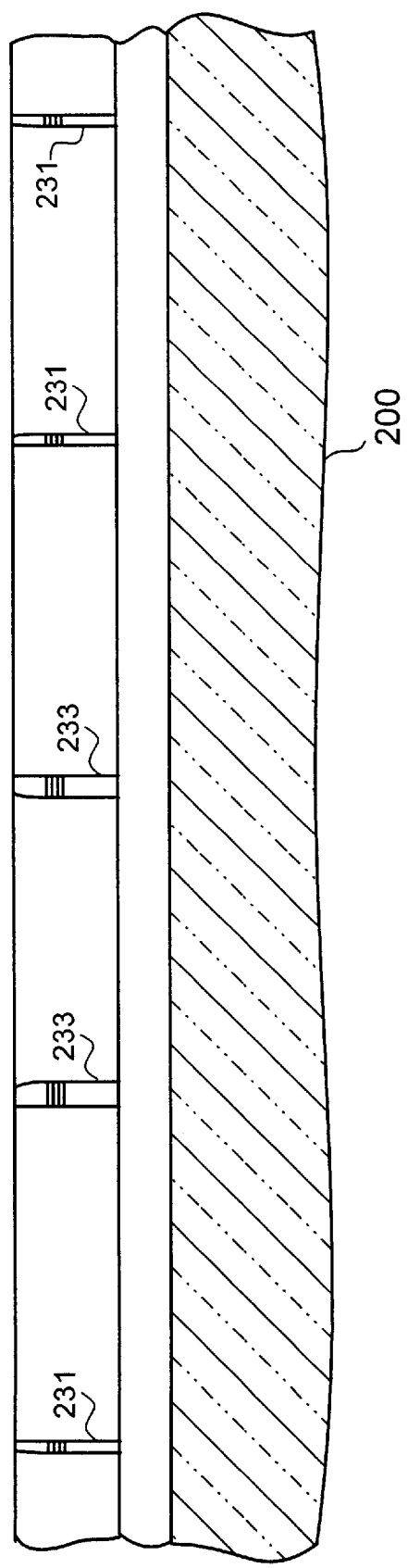

At this point in the process, the bodies of the transistors have been formed, and gates have been formed on each side of the bodies. Turning now to FIG. 13, the larger area of wafer portion 200 is again illustrated. FIG. 13 shows multiple transistors at this step in the process. Again, those transistors that were defined using narrowed sidewall spacers have a narrower body, and will thus have a higher threshold voltage. In particular, the transistor bodies 231 are narrower than transistor bodies 233. Thus, transistors formed with transistor bodies 231 will have a higher threshold voltage than transistors formed with transistor bodies 233.

Returning to method 100, the next step 116 is to pattern the gates. This involves selectively removing the portions of the gate materials that exist in adjacent the source and drain regions of the transistor. This is preferably done using standard lithographic techniques, i.e, depositing and patterning a hardmask, and then using the patterned hardmask as an etch block during an etching of the gate materials. The hardmask is preferably a nitride hardmask, as that is the same as the already formed etch stop layer on the body.

Figure 14:
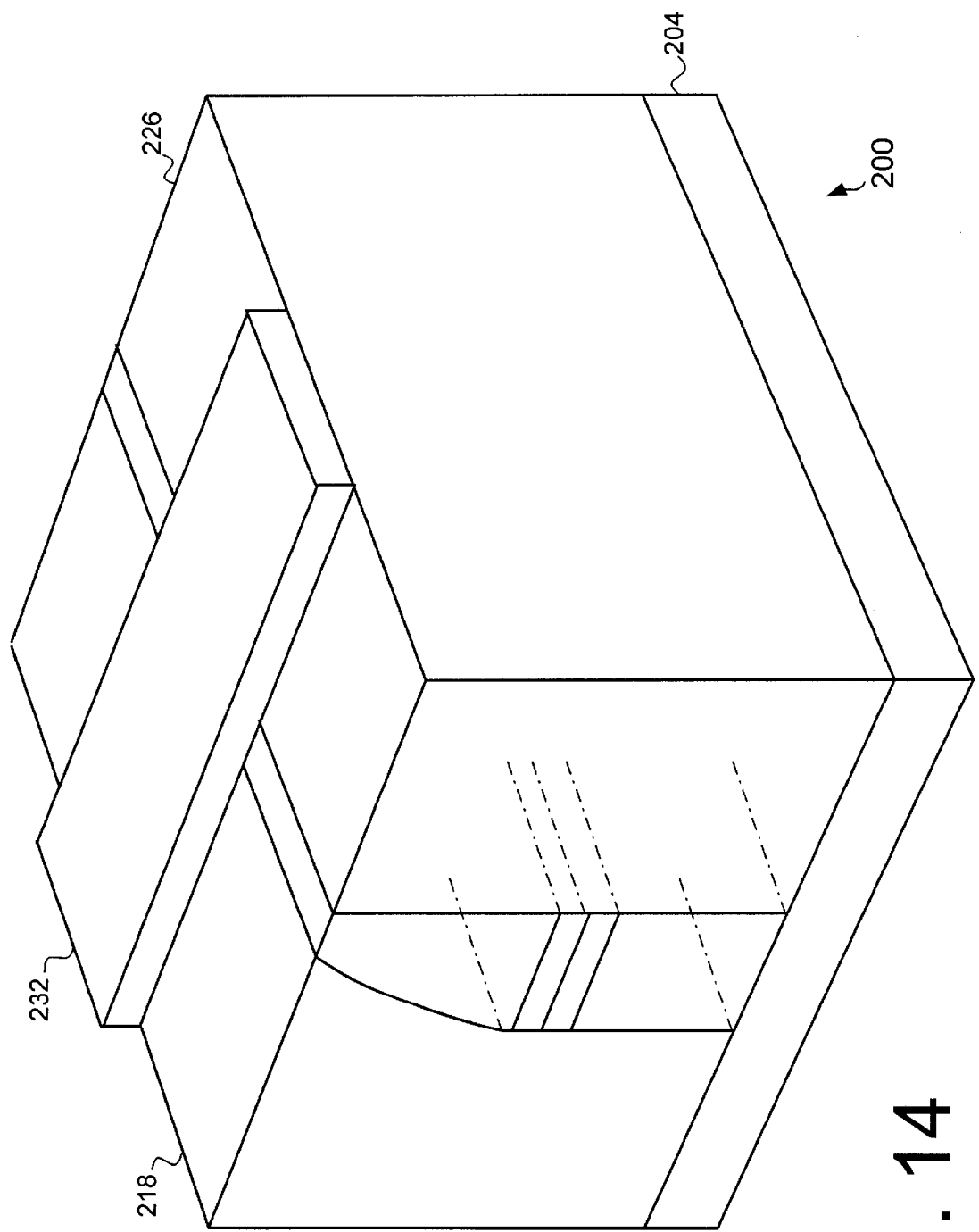
FIGS. 14–18 are perspective views of an exemplary double gated transistor during fabrication.
Figure 15:
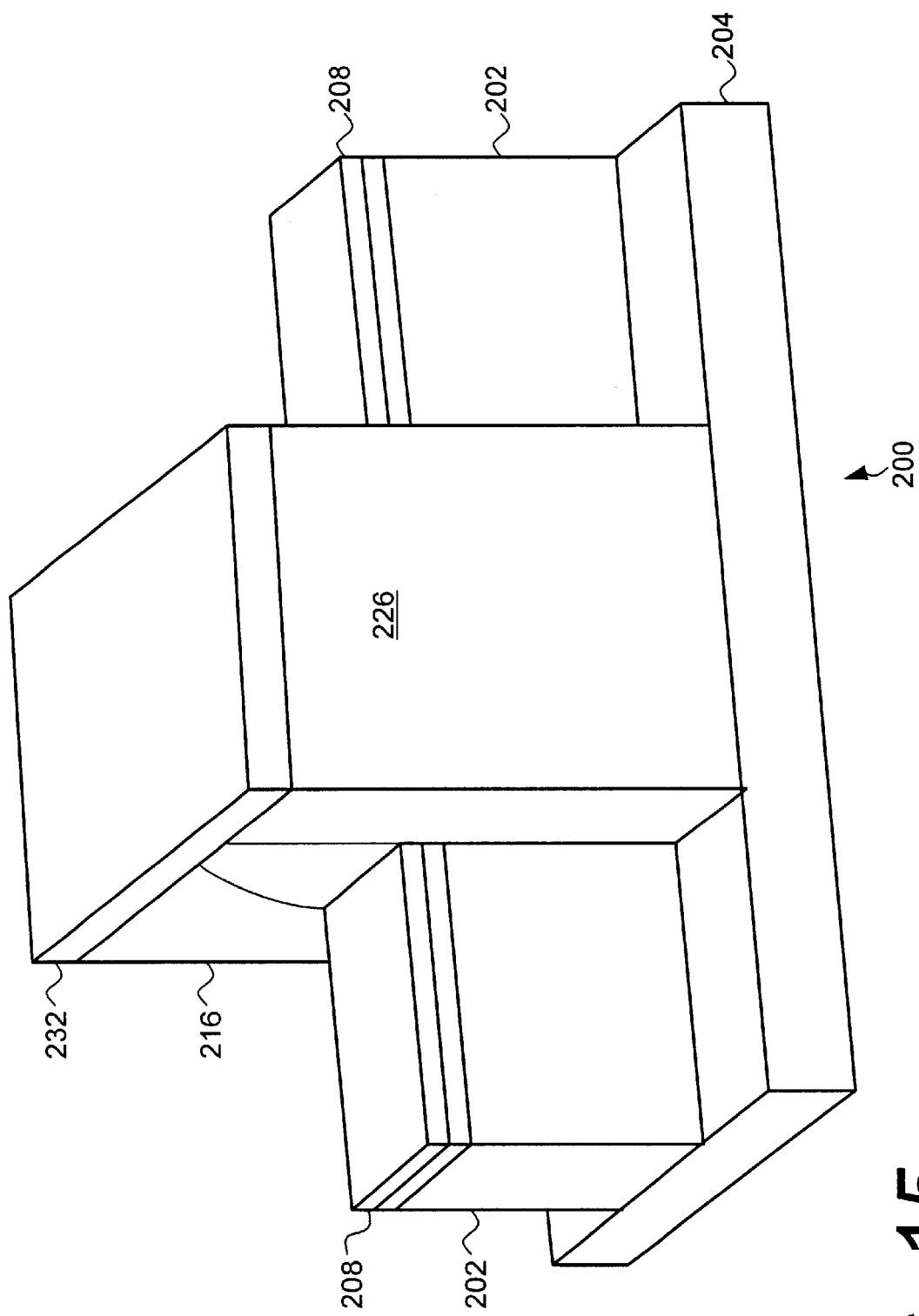

Turning now to FIG. 14, a single transistor in the wafer portion 200 is illustrated in perspective form. A nitride hardmask 232 has been formed extending across the two gates, which comprise n+ gate polysilicon 218 and p+ gate polysilicon 226. Turning now to FIG. 15, the wafer portion 200 is illustrated after gate polysilicon 218 and gate polysilicon 226 have been patterned using an etch selective to the hardmask. The patterning preferably removes all the gate polysilicon down to the buried oxide layer 204. The patterning of the gates is preferably done using a directional etch that is selective to nitride. Thus, the patterning does not remove the portions of the SOI body 202 that are protected by the previously formed nitride etch stop layer 208. The patterning leaves a portion of n+ polysilicon 218 and p+ polysilicon 226, which defines the two gates of the double gated transistor.

In the preferred embodiment a buffered HF clean up is performed, followed by a thermal reoxidation designed to grow oxide on all the exposed silicon surfaces. This preferably forms a thin 50 angstrom film of oxide that provides good interface where the gate meets the body.

The next step 118 in method 100 is to form source, drain, and halo implants in the transistor. Preferably these implants are made from at least four directions, to ensure that a uniform implant is made into both sides of the fin. In particular, both the source and drain implants are made from both sides of the source and drain portion of the fin. Then another implant is made, with a different implant energies and angles, to form the halo implants that improve short channel effects. The halo implants are performed at higher energies and at angles more acute with respect to the fin in order to assure placement of the halo dopant further under the gate electrodes than the source/drain dopants. For nFETs, typically arsenic is used for the source/drain implants in the range of 1 to 15 keV and a dose of $5 \times 10^{14}$ to $2 \times 10^{15}$ cm$^{-3}$ with angles between 45° and 80° with respect to the fins, and boron is used for the halo implants with energies in the range of 5 to 15 keV and a dose of $1 \times 10^{13}$ to $8 \times 10^{13}$ cm$^{-3}$ with the halo oriented between 20° and 45° with respect to the fins. Similarly, for pFETs, typically boron is used for the source/drain implants in the range of 0.5 to 3 keV and dose of $5 \times 10^{14}$ to $2 \times 10^{15}$ cm$^{-3}$ with angles between 45° and 80° with respect to the fins, and arsenic used for the halos, with energies from 20 to 45 keV and dose of $1 \times 10^{13}$ to $8 \times 10^{13}$ cm$^{-3}$ with the halo oriented between 20° and 45° with respect to the fins. Furthermore, all of the above implants must be suitable angles from the horizontal plane of the wafer, between approximately 70° to 83° from horizontal.

Figure 16:
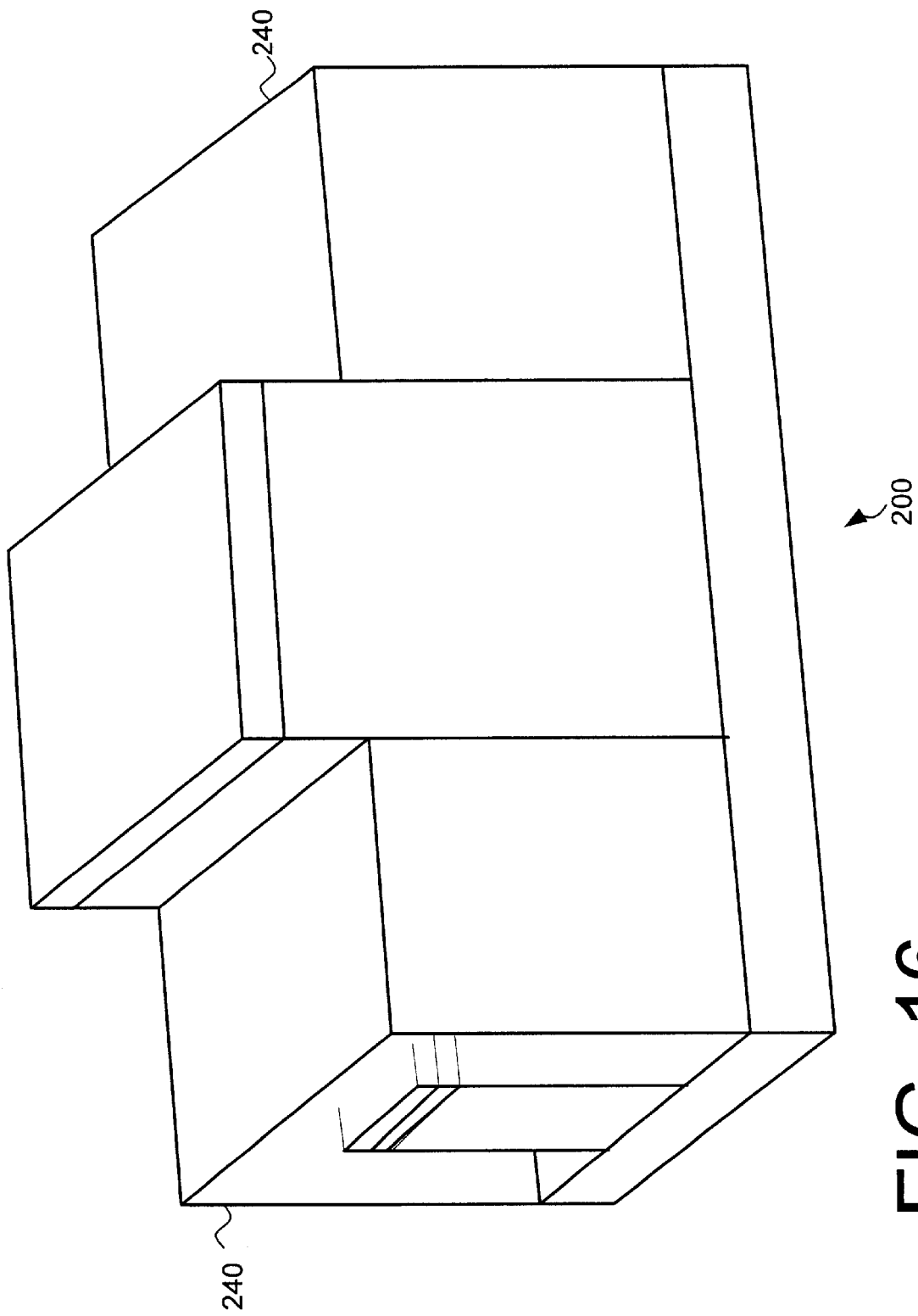

The next step 120 is to deposit dielectric of thickness greater than the height of the combined gate electrode and hardmask above the BOX, covering the entire gate electrodes and exposed fins, planerize and partially recess until a portion (typically 10 to 50 nm) of the hardmask and gate electrode, but not any of the source/drain fin region, is exposed.. As will become clear, this step is part of the formation of sidewall spacers at the edges of the transistor gate. The dielectric used preferably comprises oxide, which can be etched selective to the nitride hardmask already formed. Turning now to FIG. 16, the wafer portion 200 is illustrated after dielectric 240 has been deposited, surrounding the transistor gate electrode, planarized and then recessed. The dielectric is preferably recessed using a directional etch selective to the previously provided nitride hardmask 232.

The next step 122 is to form sidewall spacers on the edges of the gates, and etch the previously deposited dielectric. This is preferably done using a conformal deposition of a dielectric material, followed by a directional etch. The sidewall spacers are preferably formed of nitride. The nitride sidewall spacers, together with the nitride hardmask, can then be used to mask a directional etch and thereby remove the oxide except adjacent to the gates.

Figure 17:
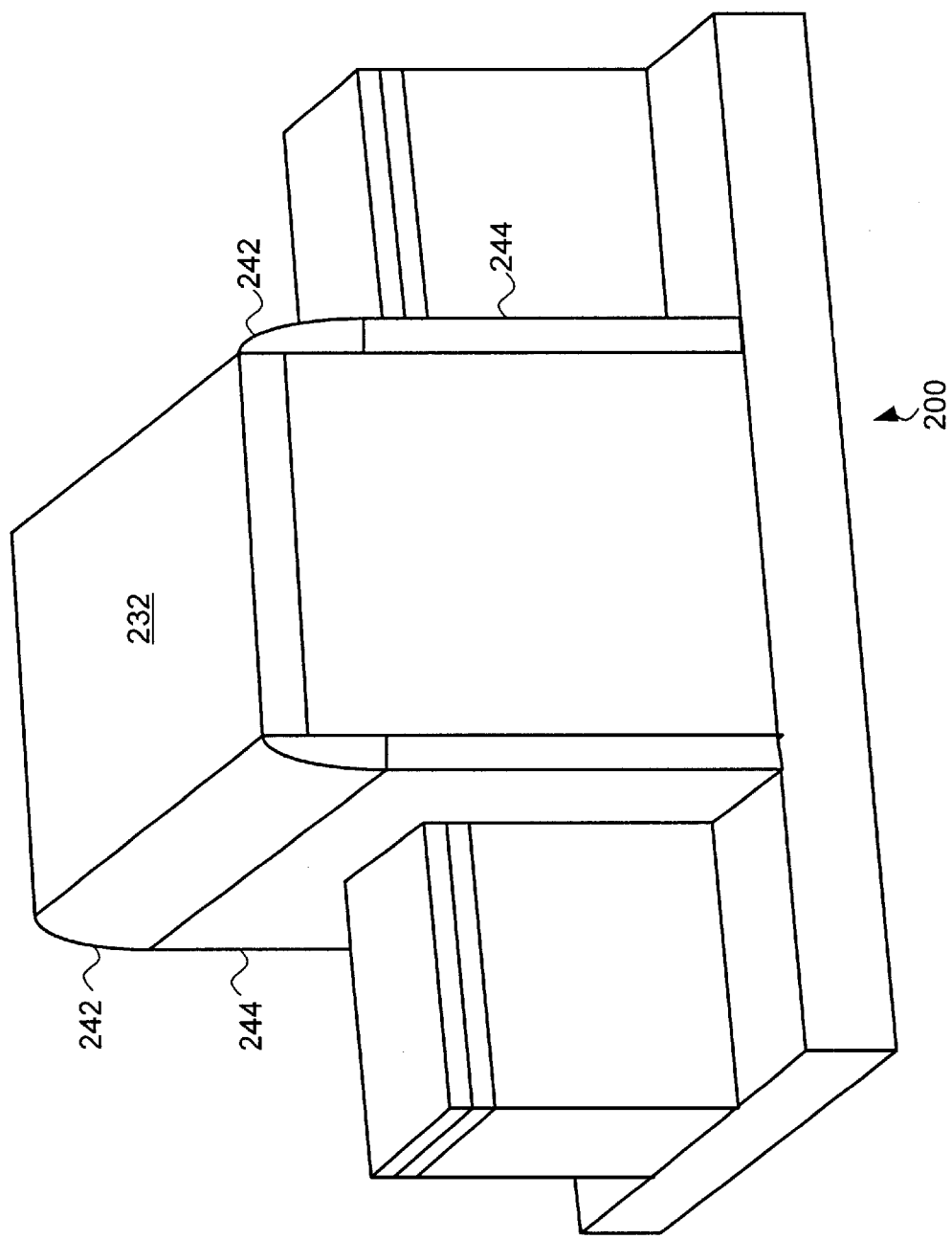

Turning now to FIG. 17, the wafer portion 200 is illustrated after nitride sidewall spacers 242 have been formed, and the dielectric 240 etched away, leaving only sidewall portions 244 adjacent the transistor gates. The hardmask 232, the sidewall spacers 242, and the sidewall portions 244 combine to effectively isolate the gate from the source and drain contacts, which are formed next.

Figure 18:
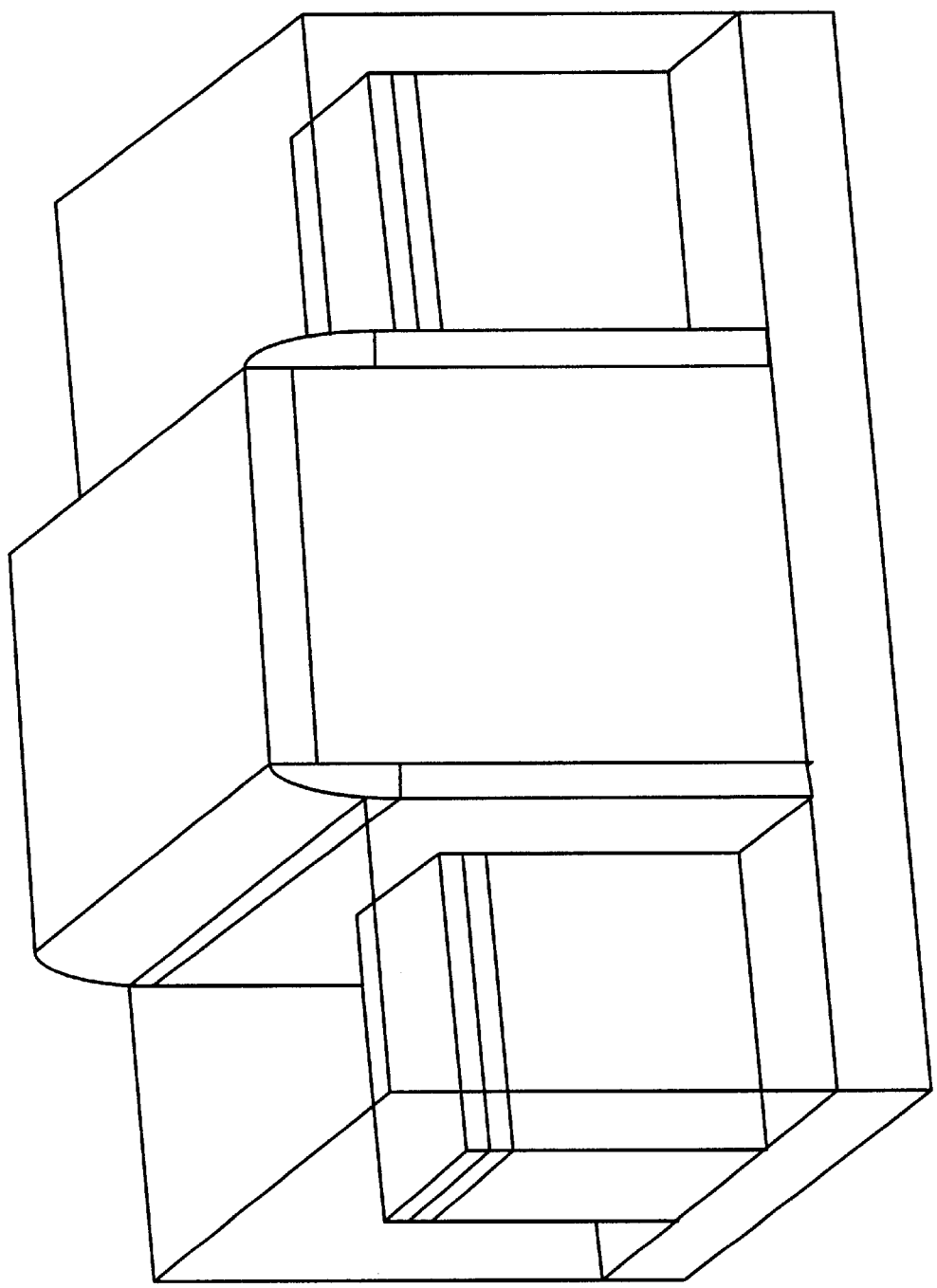

The next step 124 is to form source and drain contacts. This is preferably done by filling the previously removed areas with contact material. The contact material can be a selective deposition of silicon, tungsten or other conductive material which makes low-resistance contacts to n+ and/or p+ silicon. If silicon is used, it is doped degenerately n+ or p+ for nFETs or pFETs, respectively. The material can be deposited until it covers the wafer to a height above the height of the nitride hardmask and then planarized by RIE and/or chemical-mechanical polish until the nitride hardmask is completely exposed. Next, as illustrated in FIG. 18, the wafer is patterned with a mask which is used to etch unwanted portions of the source/drain contact material to both isolate source from drain and to isolate a plurality of such FETs from each other. Finally, the hardmask may be selectively removed by RIE or other etching techniques such as hot phosphoric acid, and a metal such as cobalt or titanium deposited and sintered at approximately 700° C. to form metal silicide over the gate, and in the case of silicon contacts, over the source and drain contacts as well.

Thus, method 100 provides for the formation of double gated transistors and allows the gate length of the device to have minimum feature size, while allowing the thickness of the body to be much smaller than the gate length. Furthermore method 100 results in double gate transistors with asymmetric gate doping, where one of the double gates is doped degenerately n-type and the other degenerately p-type. By doping one of the gates n-type, and the other p-type, the threshold voltage of the resulting device is improved. Finally, method 100 provides for the formation of double gate transistors having different threshold voltages in one fabrication process. The embodiments of the present invention form transistors having different body widths. By forming double gate transistors with different body widths, the preferred embodiment forms double gate transistors that have different threshold voltages, without adding excessive process complexity.

Figure 19:
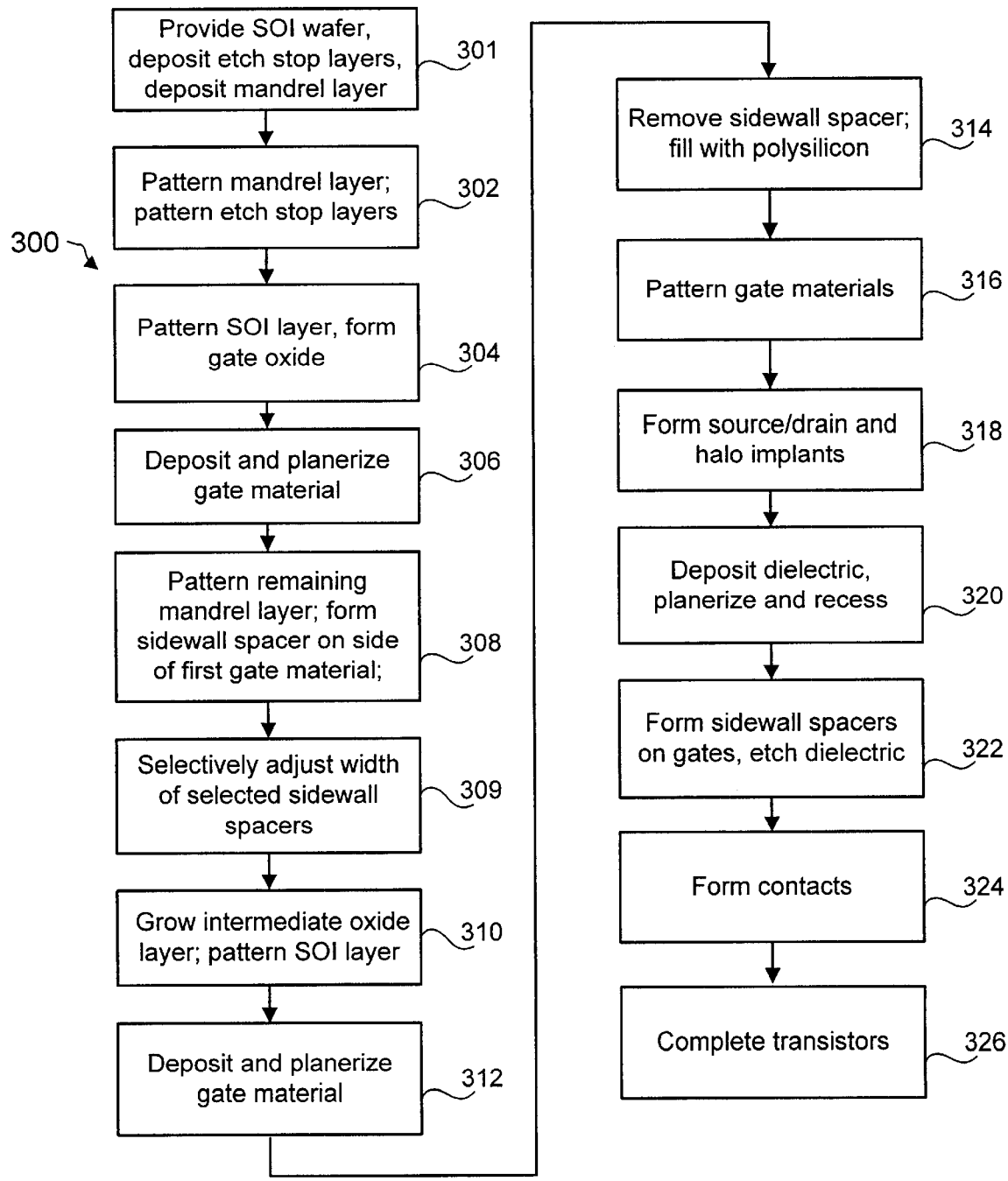
FIG. 19 is a flow diagram illustrating a second fabrication method.
Figure 20:
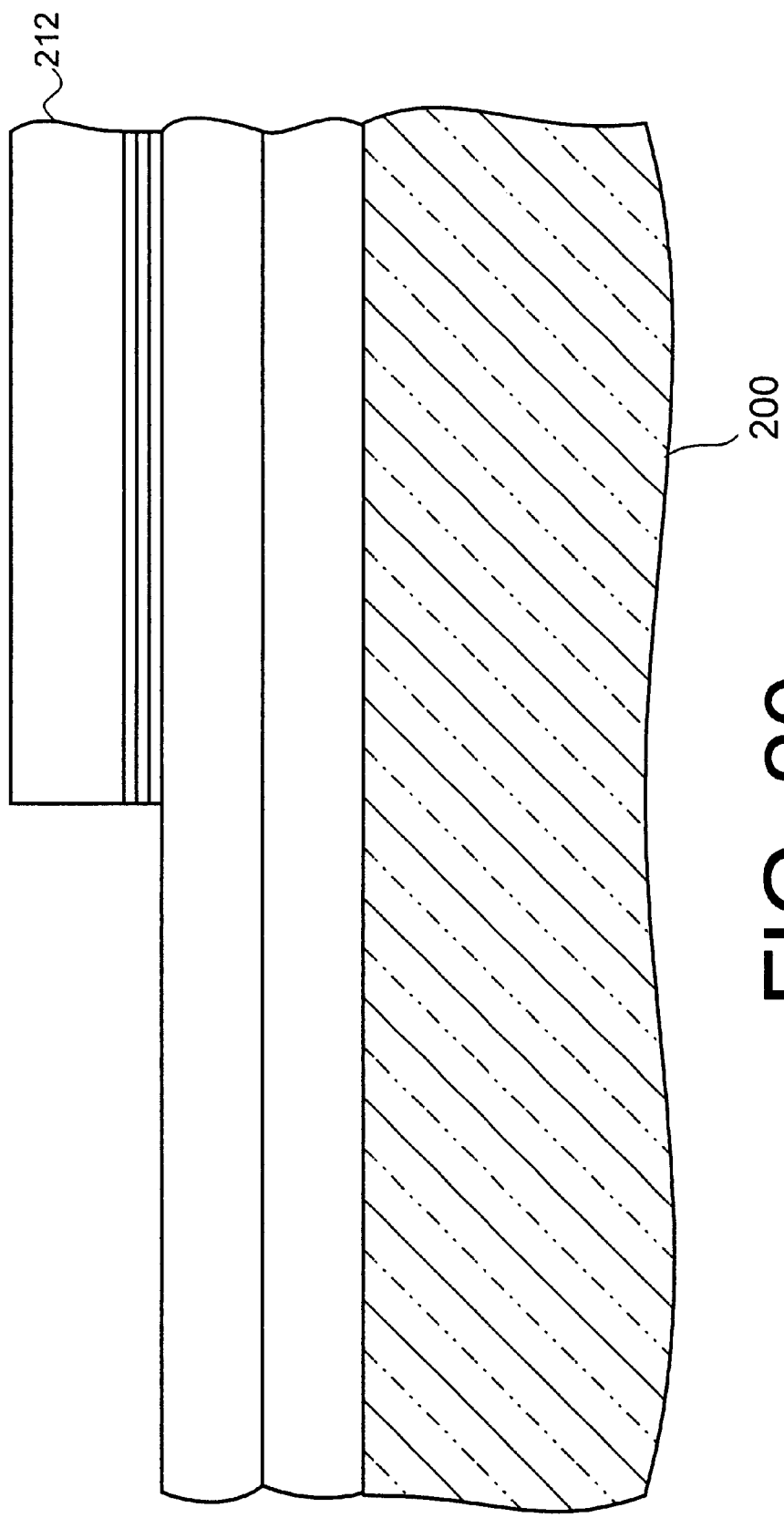
FIGS. 20–31 are cross-sectional side views of a second exemplary double gated transistor during fabrication.

Turning now to FIG. 19, a alternative preferred embodiment method 300 is illustrated. This method has the advantage of resulting in minimal erosion of the sidewall spacer used to define the transistor body since the spacer is now exposed to reactive ion etching only once. Consequently the silicon etch profiles achieved with this embodiment are very well controlled. In step 301, the wafer is prepared, etch stop layers and a mandrel layer is formed in as in step 101 of the method 100 described above. Then in step 302, the mandrel layer is patterned and the etch stop layers are directly etched. This differs from method 100 in that no sidewall spacer is formed on the mandrel layer before the etch stop layers are patterned. Turning to FIG. 20, the wafer portion 200 is illustrated after the formation of the etch stop layers, the mandrel layer, and the etching of the mandrel layer and etch stop layers directly.

The next step 304 is to pattern the SOI layer using the remaining mandrel layer as a mask, and to form gate oxide on the exposed side of the SOI layer. This is preferably done using a suitable reactive ion etch, followed by a thermal oxidation, typically at between 750° C. and 800° C., or by CVD deposition of a high-k material such as aluminum oxide. Also, during this step, an implantation into the body of the transistor can be done. This would preferably comprise an angled implant into the exposed sidewall of the SOI layer, done before the formation of the gate oxide. This implant serves to properly dope the body of the transistor. As will be described in greater detail below, this implant can be performed in a way that achieves uniform concentration density to help compensate for threshold voltage variations that would otherwise result from variations in body thickness.

Figure 21:
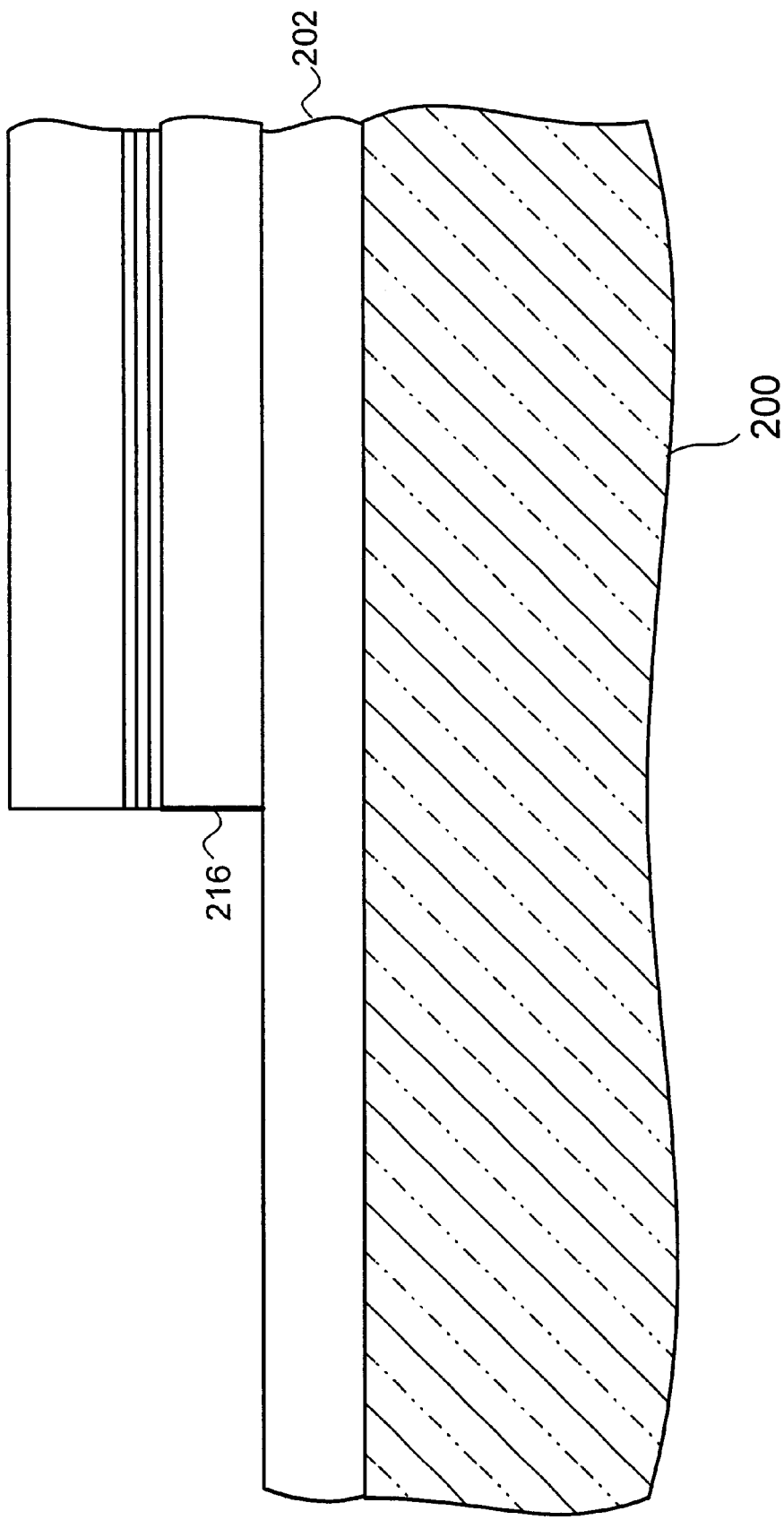

Turning now to FIG. 21, the wafer portion 200 is illustrated after the SOI layer 202 has been patterned and gate oxide 216 has been formed on the side of the SOI layer 202. Again, an angled body implant can also be performed before the formation of the gate oxide.

Figure 22:
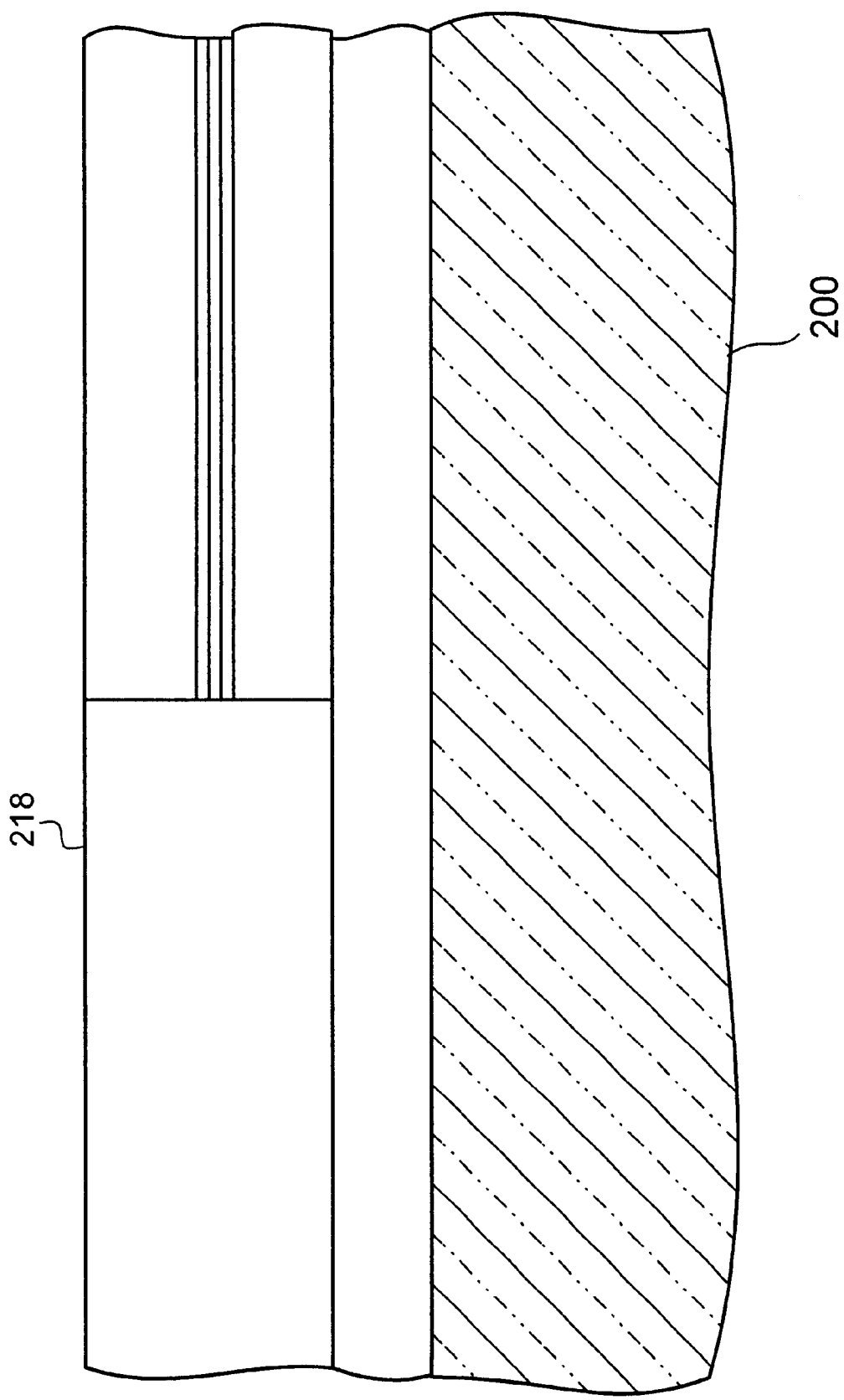

Returning to FIG. 19, the next step 306 is to deposit and planerize the gate material. As described above, in the preferred embodiment, the double gated transistor has one gate formed n+ and the other gate formed p+. In the illustrated embodiment, the gate n+ gate is formed first. Turning to FIG. 22, the wafer portion 200 is illustrated after n+ polysilicon 218 has been deposited and planarized. As will become clear, n+ polysilicon will be used to form one of the gates in the preferred embodiment double gated transistor.

Figure 23:
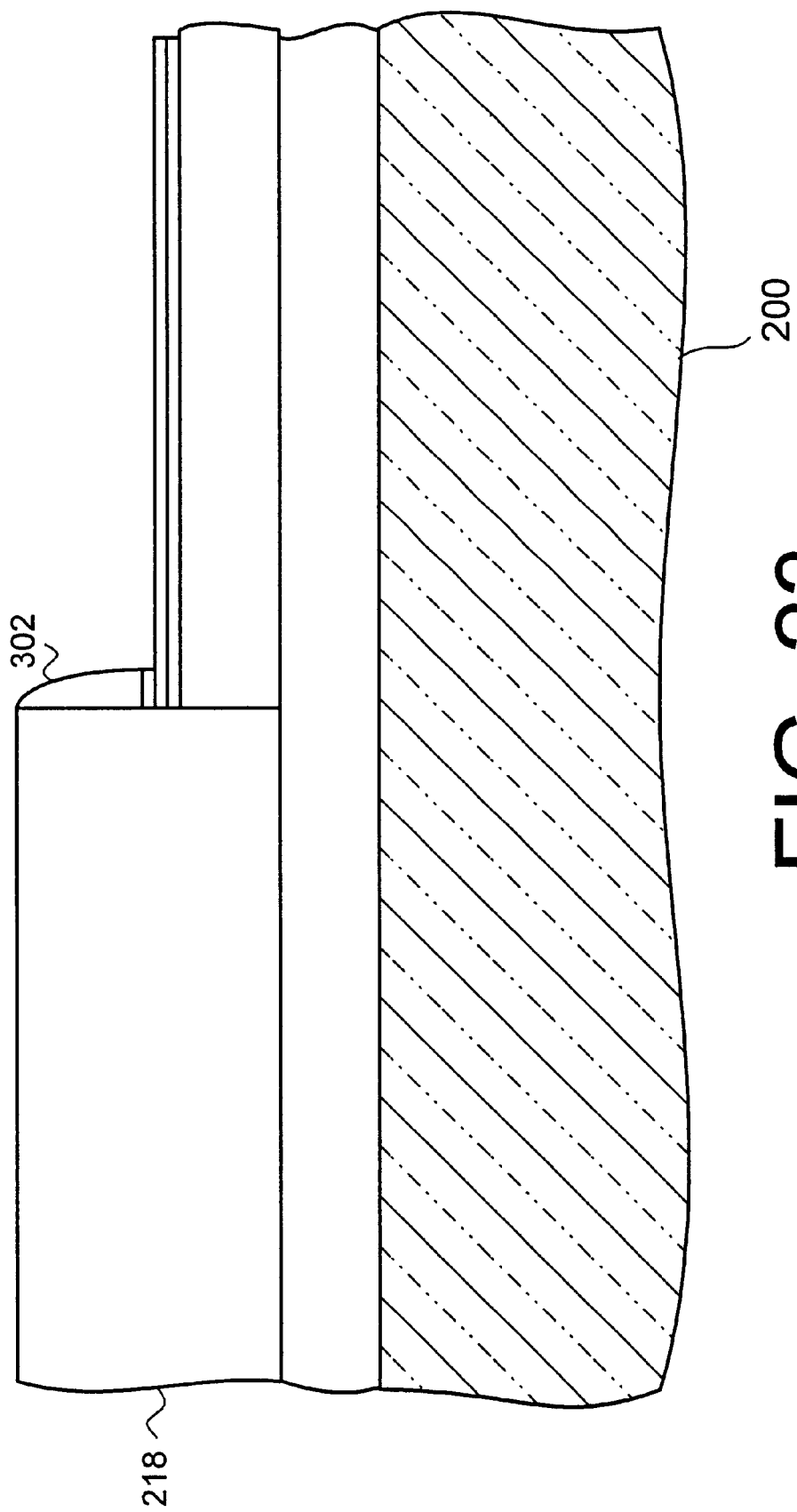

The next step 308 is to remove the remaining mandrel material, form a sidewall spacer along the edge of the remaining first gate material. As will be clear later on, the width the sidewall spacer will determine the width of the transistor body. Turning now to FIG. 23, the wafer portion 200 is illustrated after the mandrel layer 212 has been removed, the sidewall spacer 302 formed on the sidewall of the first gate material.

Returning to FIG. 19, the next step 309 is to selectively adjust the width of selected sidewall spacers. As explained above, the threshold voltage of the resulting transistor varies with the transistor body width. The preferred embodiments vary the width of selected sidewall spacers to allow different transistors with different body widths and thus different threshold voltages to be formed in one fabrication process. As with method 100, the width of the sidewall spacers can be adjusted in any suitable manner. For example, they can be can covered with a suitable protective layer, with the protective layer then being patterned to exposed selected sidewall spacers. For example, a suitable photoresist layer can be deposited and patterned to expose only selected sidewall spacers. The width of the exposed sidewall spacers can then adjusted. For example, an isotropic etch of short duration can be used that results in narrowing of only the exposed sidewall spacers, with unexposed sidewall spacers remaining unchanged. Any isotropic etch which removes a portion of the exposed sidewall spacers while not significantly removing the oxide is suitable for this step.

Figure 24:
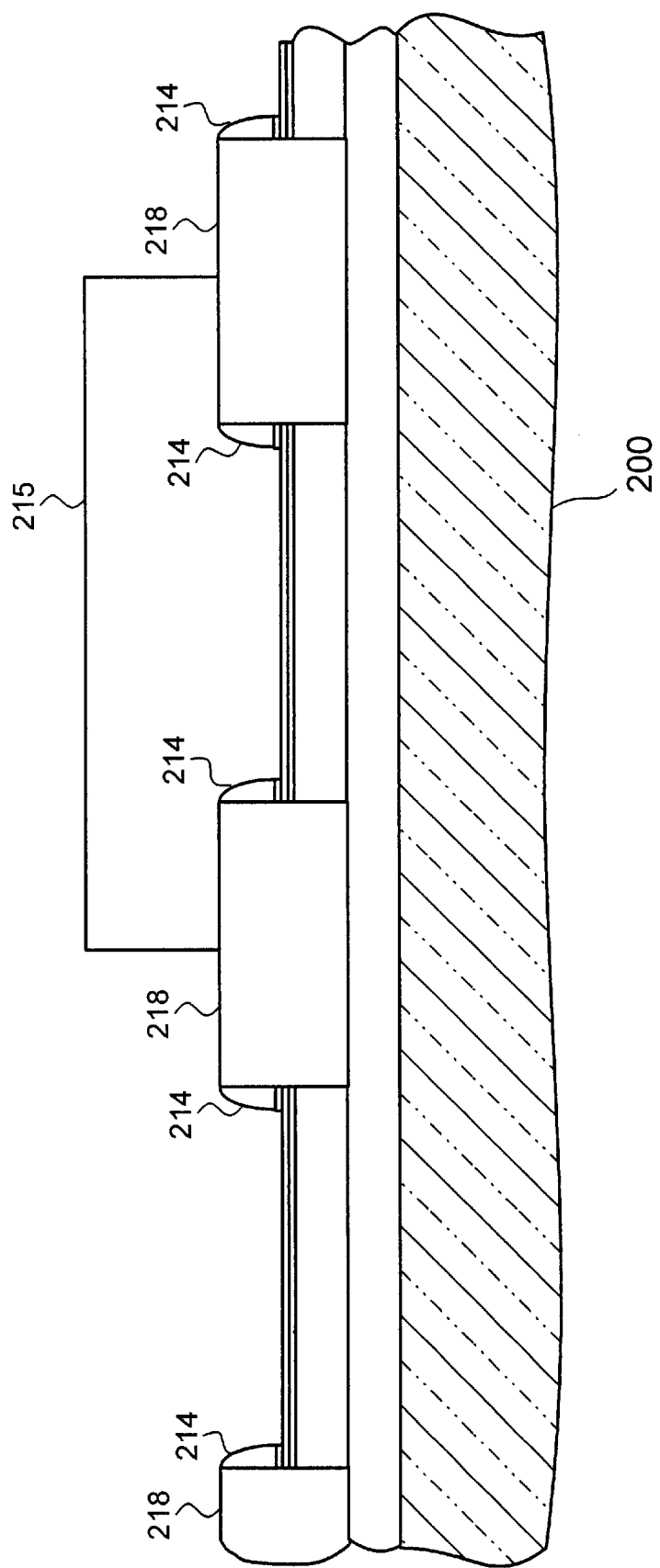

Turning now to FIG. 24, a larger area of wafer portion 200 is illustrated that shows a plurality of sidewall spacers 214 formed on the exposed edges of gate material 218. Each of the sidewall spacers 214 will be used to define a transistor body for a double gate field effect transistor. In accordance with method 300, a layer of photoresist 215 has been deposited and patterned to expose selected sidewall spacers 214 while other sidewall spacers remain covered by the photoresist 214. This allows the width of the exposed sidewall spacers 214 to be adjusted relative to the width of the unexposed sidewall spacers 214. For example, by performing an isotropic etch that selectively narrows only the exposed sidewall spacers 214.

Figure 25:
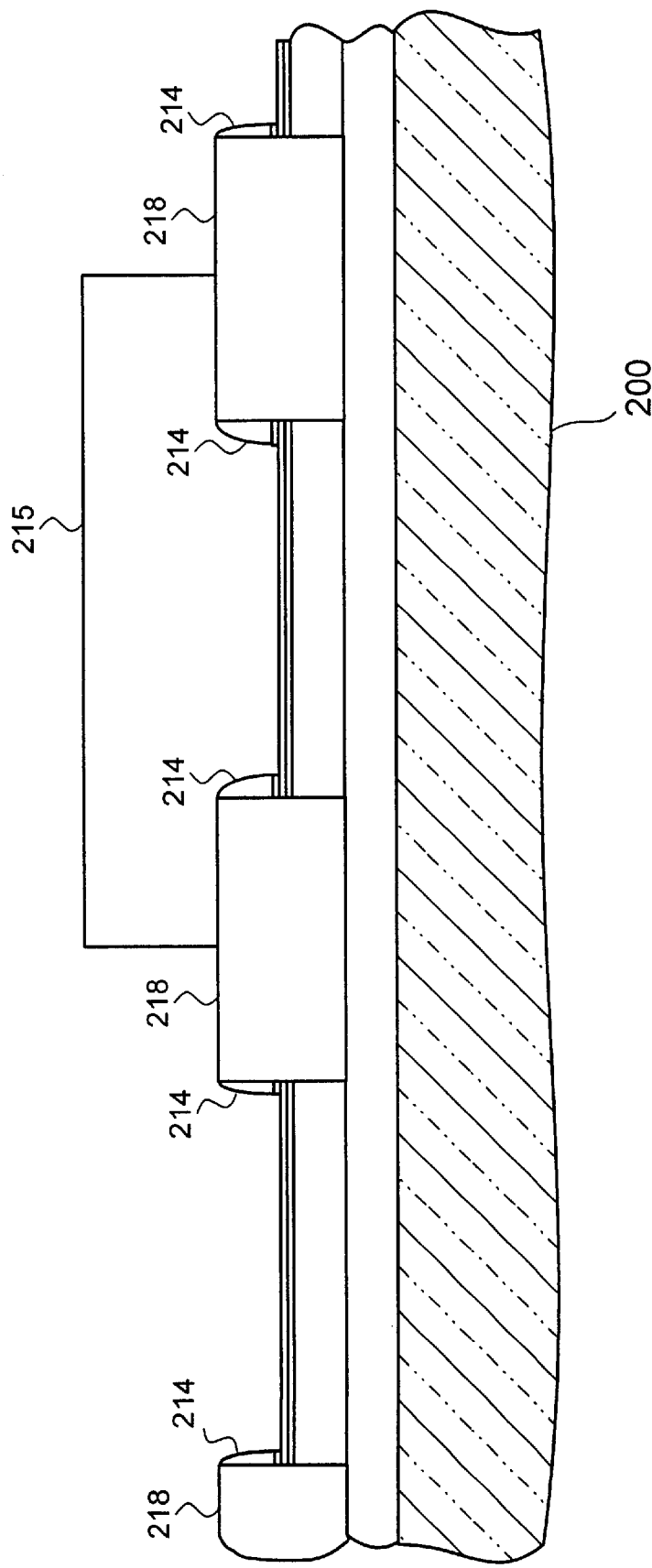

Turning now to FIG. 25, the larger area of wafer portion 200 is illustrated after the exposed sidewall spacers 214 have been narrowed using a suitable etch. Again, as will become clear, the width of the sidewall spacer ultimately determines the body width and hence the threshold voltage of the resulting transistors. Thus, transistors made using narrowed sidewall spacers will have a narrower body than those made with non-narrowed sidewall spacers. The transistors with a narrowed body will have a higher threshold voltage relative to the those with the non-narrowed body.

Returning to the method 300, the remaining steps 310 through 326 will now be described and illustrated with only one transistor body, but it will be again understood that the same steps will be applied to both narrowed and non-narrowed transistors. The next step 310 is to form an intermediate oxide layer on the gate material and to pattern the SOI layer.

Figure 26:
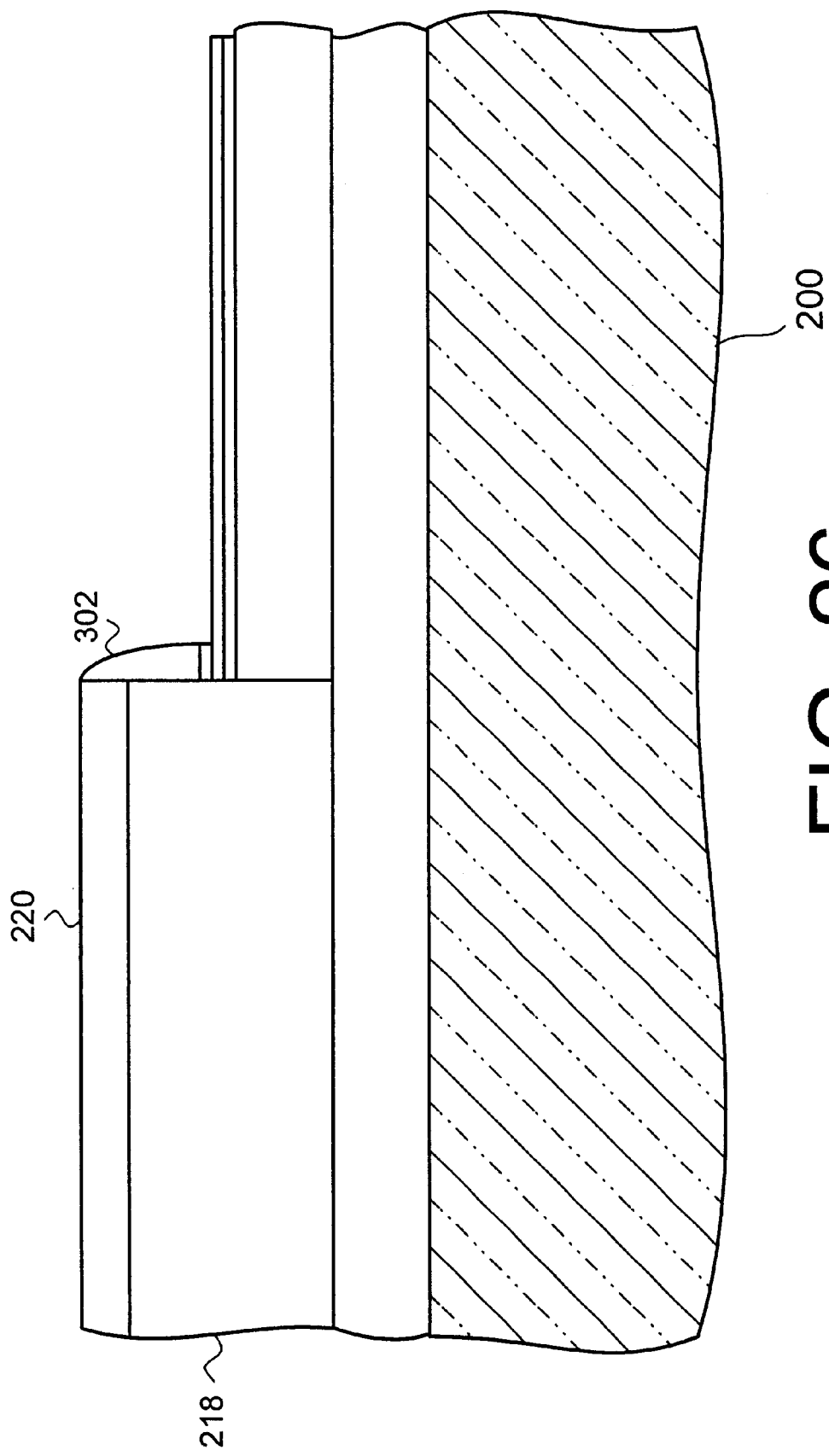

Turning now to FIG. 26, the wafer portion 200 is illustrated after an intermediate thermal oxide layer 220 has been formed on the gate polysilicon 218. The nitride layer 208 that was beneath the remaining mandrel layer is etched selectively to the oxide 220 followed by a brief HF etch which removes the remaining oxide layer 206 which was beneath the remaining mandrel layer.

The SOI layer is preferably patterned using a reactive ion etch that etches the SOI layer, stopping on the buried oxide layer. This completes the patterning of the SOI layer to define the thickness of the body of the double gated transistor. Gate oxide is then formed on the exposed side of the transistor body. Again, during this step a implantation into the body of the transistor can be performed. This would again preferably comprise an angled implant into the exposed sidewall of the SOI layer, done before the formation of the gate oxide.

Figure 27:
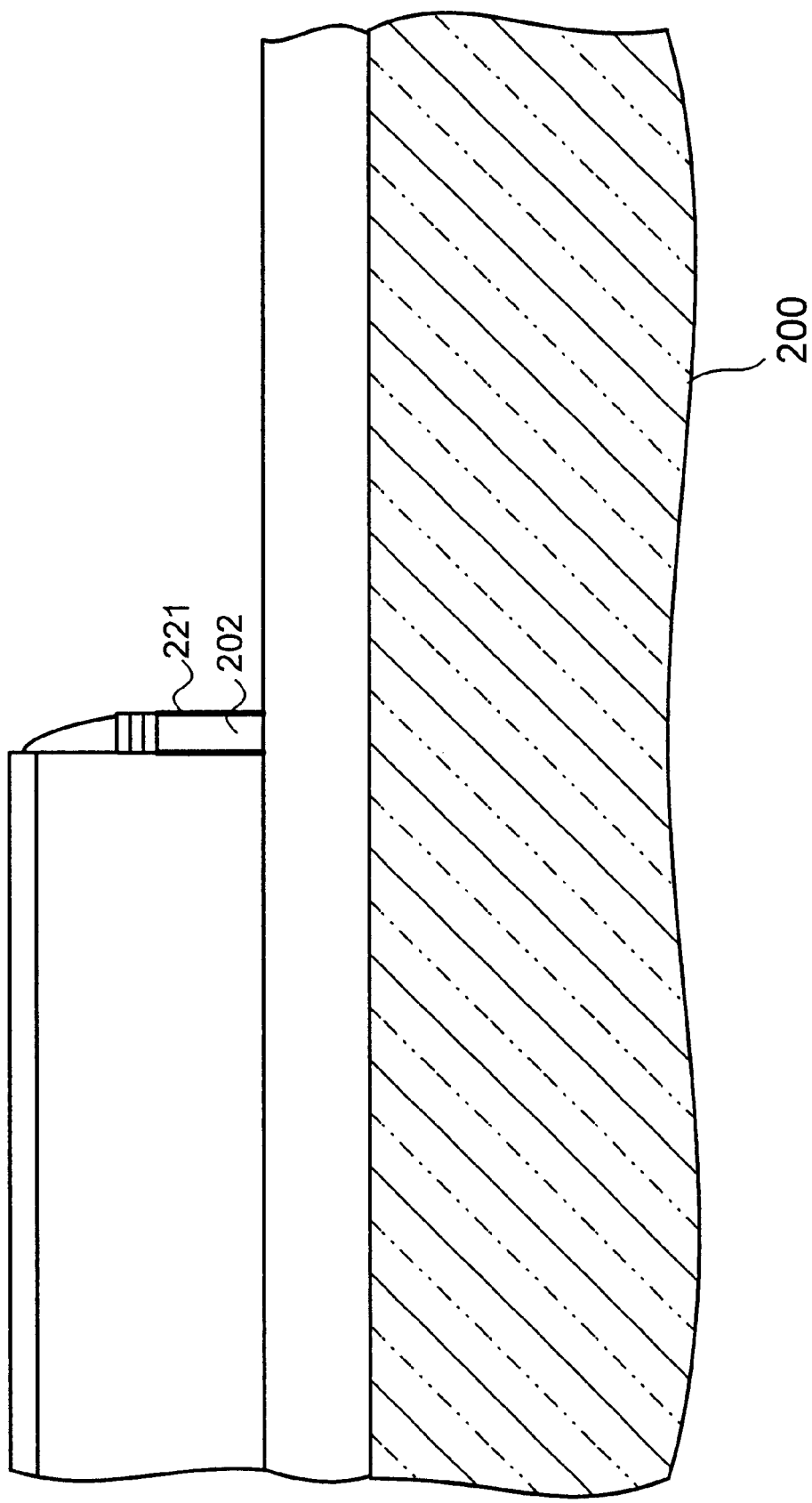

Turning now to FIG. 27, the wafer portion 200 is illustrated after the patterning of the SOI layer 202. The remaining portion of the SOI layer 202 comprises the body of the doubled gated transistor. The width of the body was determined by the width of the sidewall spacer 214 used to define it. Thus, by selectively varying the width of the sidewall spacer, transistors with different body widths are formed. Gate oxide 221, is formed on the exposed SO layer 202 using a thermal oxidation or by depositing a dielectric film.

Figure 28:
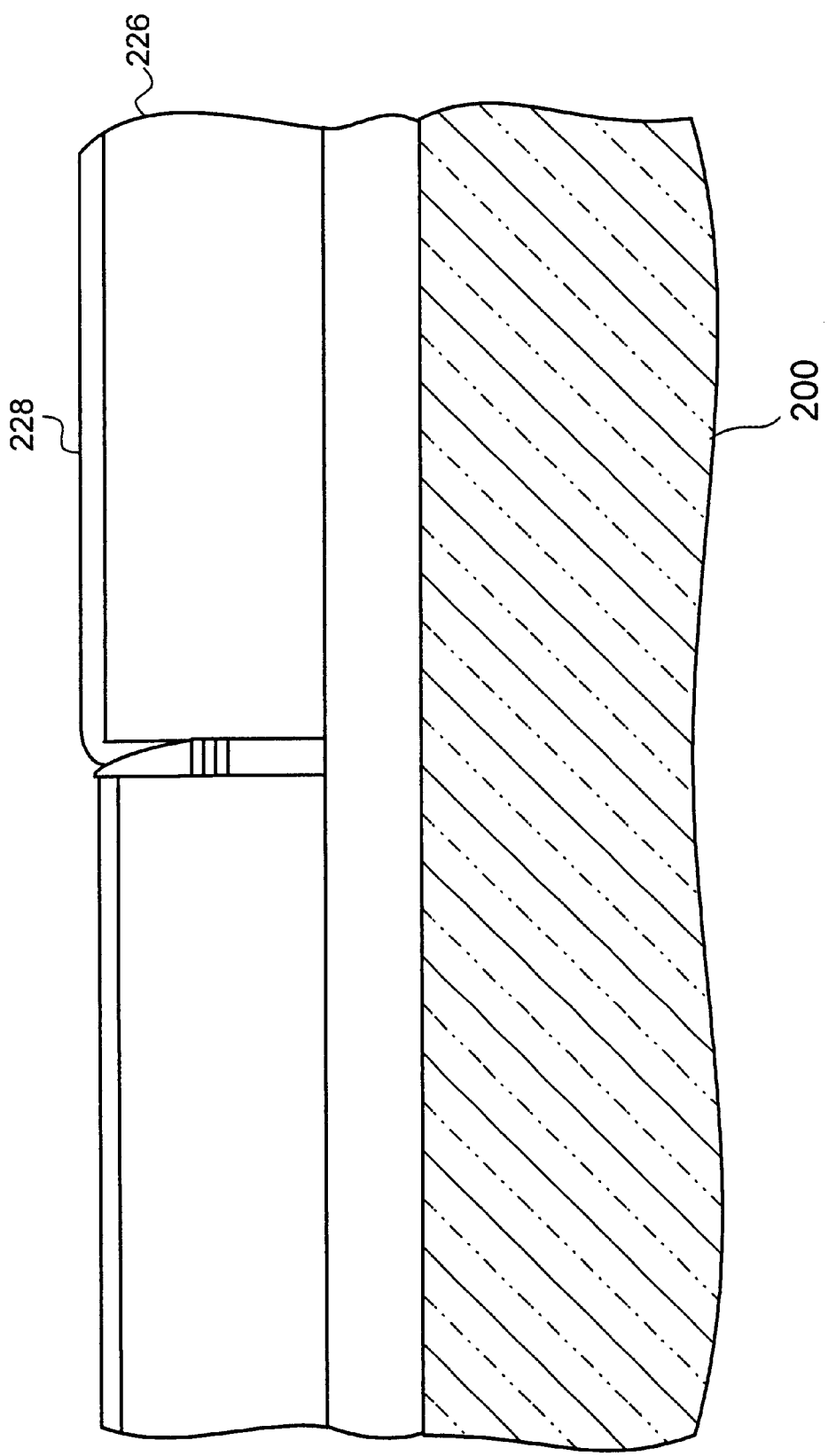

The next step 312 is to deposit and planerize the gate material for the second gate. As discussed above, the preferred embodiment uses gate material of opposite doping to form the two gates. Thus, the preferred embodiment uses p+ doped polysilicon to form the second of the two gates. The planarization of the p+ polysilicon gate material stops on the thermally grown oxide previously formed on the n+ polysilicon gate. After the planarization of the p+ polysilicon, a second layer of thermally grown oxide is formed. Turning now to FIG. 28, the wafer portion 202 is illustrated after the deposition and planarization of p+ doped polysilicon 226 to form the second gate. Thermally grown oxide 228 is then formed on the deposited polysilicon 226.

Figure 29:
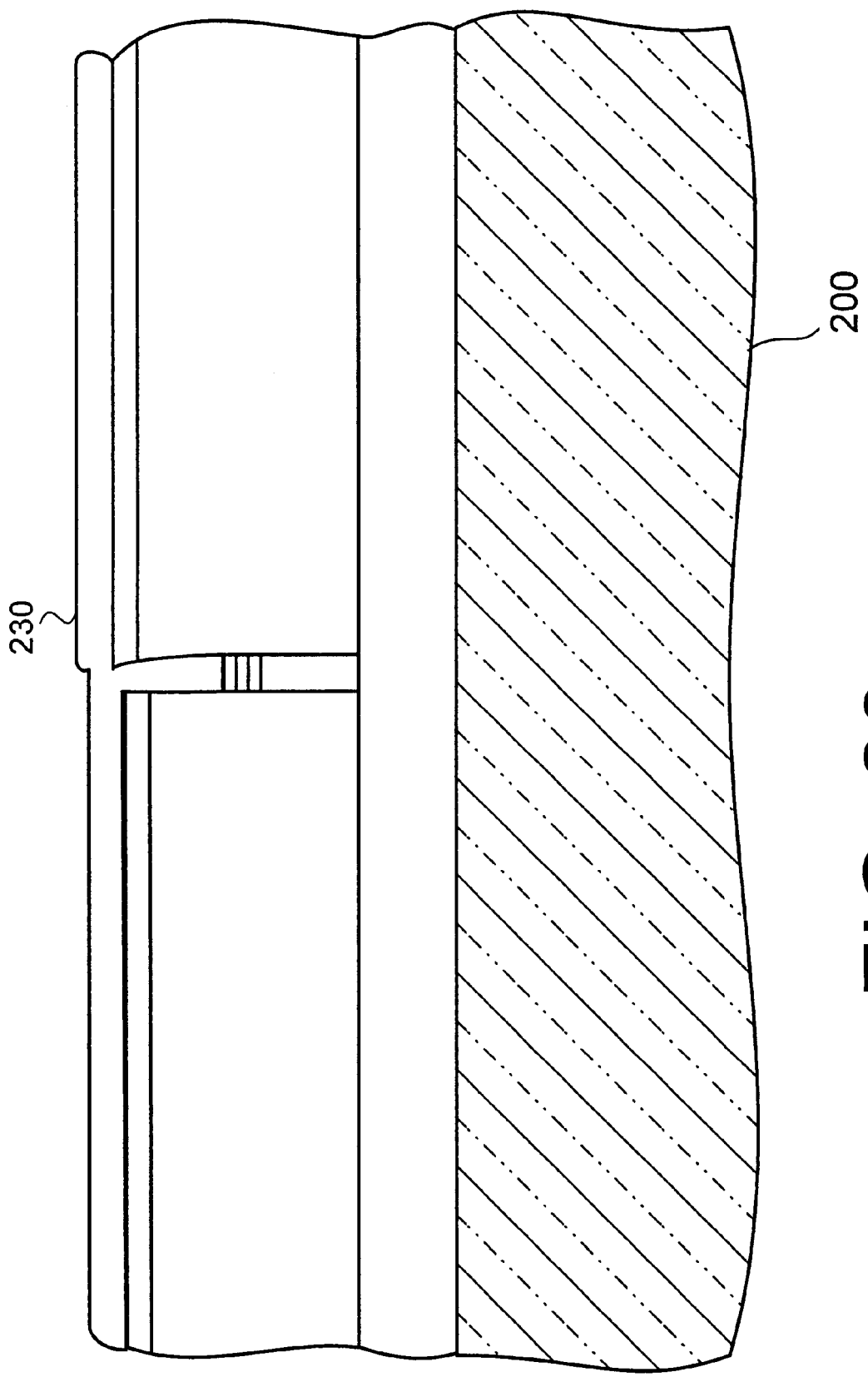
Figure 30:
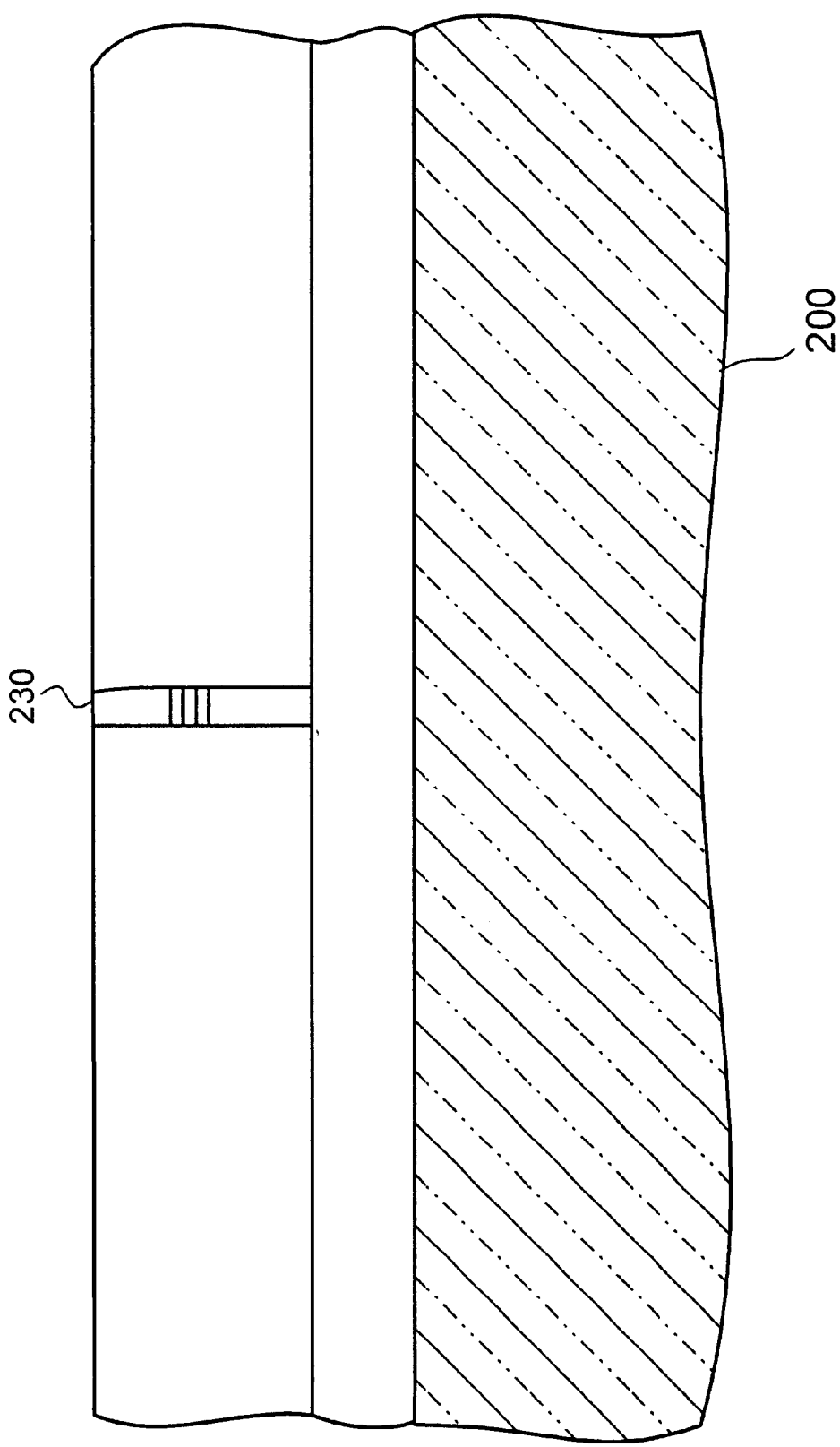

The next step 314 is to remove the sidewall spacer, and fill the sidewall spacer opening with intrinsic polysilicon, to maximize silicide formation in this region later on in the process. Optionally, the sidewall spacer may be left in place if the separate, independent gate contacts are desirable. The intrinsic polysilicon is then planarized using a CMP process that stops on the two layers of thermally grown oxide. This planarization process does not require high selectivity because there is very little excess intrinsic polysilicon to remove. The exposed thermally grown oxide on the two gates is then removed using a similar planarization process. Again, high selectivity is not required for this processing step. Turning now to FIG. 29, the wafer portion 200 is illustrated after the remaining portion of the sidewall spacer 302 has been removed, and then the space is filled with intrinsic polysilicon 230. FIG. 30 then illustrates the wafer portion 200 after the excess polysilicon 230 and thermally grown oxide 220 and 228 have been removed by CMP process. This leaves only a small portion of the intrinsic polysilicon 230 in the place of the originally formed sidewall spacer. This portion of intrinsic polysilicon 230 will be used to allow the formation of a silicide bridge connecting the p+ and n+ polysilicon gates later in the process flow.

Figure 31:
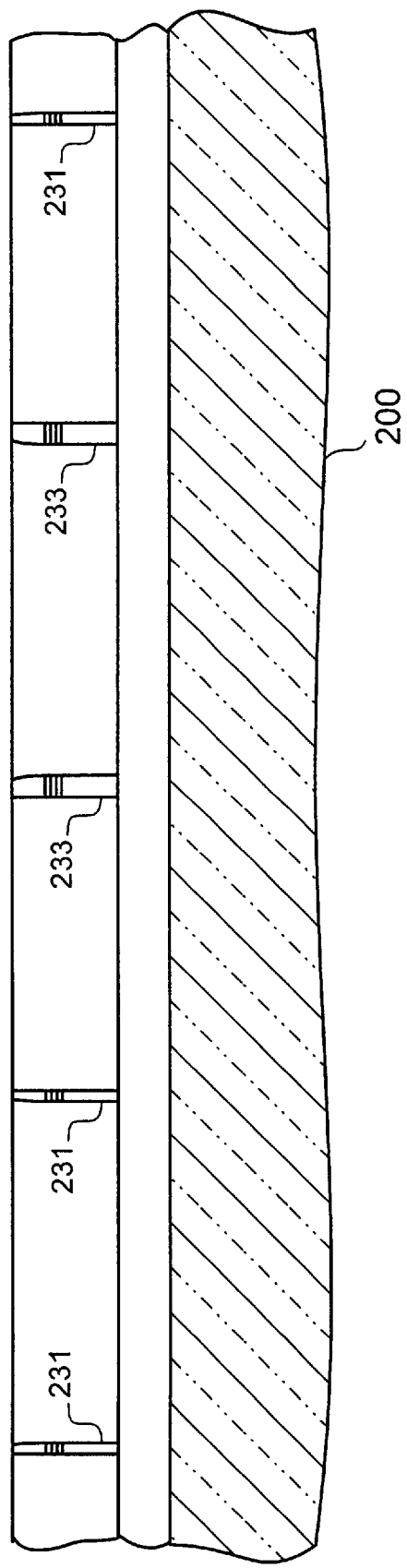

At this point in the process, the bodies of the transistors have been formed, and gates have been formed on each side of the bodies. Turning now to FIG. 31, the larger area of wafer portion 200 is again illustrated. FIG. 11 shows multiple transistors at this step in the process. Again, those transistors that were defined using narrowed sidewall spacers have a narrower body, and will thus have a higher threshold voltage. In particular, the transistor bodies 231 are narrower than transistor bodies 233. Thus, transistors formed with transistor bodies 231 will have a higher threshold voltage than transistors formed with transistor bodies 233.

Returning to method 300, the remaining steps 316 to 326 are identical to steps 116 to 126 described in method 100.

Method 300, like method 100, provides for the formation of double gated transistors and allows the gate length of the device to have minimum feature size, while allowing the thickness of the body to be much smaller than the gate length. Furthermore method 300 results in double gate transistors with asymmetric gate doping, where one of the double gates is doped degenerately n-type and the other degenerately p-type. By doping one of the gates n-type, and the other p-type, the threshold voltage of the resulting device is improved. Finally, method 300 provides for the formation of double gate transistors having different threshold voltages in one fabrication process. Method 300 has the additional advantage of resulting in minimal erosion of the sidewall spacer used to define the transistor body since the spacer is now exposed to reactive ion etching only once. Consequently the silicon etch profiles achieved with this embodiment are very well controlled.

Thus, the present invention provides a double gated transistor and a method for forming the same that results in improved device performance and density. The preferred embodiment of the present invention uses provides a double gated transistor with asymmetric gate doping, where one of the double gates is doped degenerately n-type and the other degenerately p-type. By doping one of the gates n-type, and the other p-type, the threshold voltage of the resulting device is improved. In particular, by asymmetrically doping the two gates, the resulting transistor can, with adequate doping of the body, have a threshold voltage in a range that enables low-voltage CMOS operation.

The present invention also provides a double gate transistor and a method for forming the same that facilitates the formation of different transistors having different threshold voltages. The embodiments of the present invention form transistors having different body widths. By forming double gate transistors with different body widths, the preferred embodiment forms double gate transistors that have different threshold voltages, without adding excessive process complexity.

While the invention has been particularly shown and described with reference to an exemplary embodiment using a fin type double gated field effect transistor, those skilled in the art will recognize that the preferred embodiment can be applied to other types of double gated transistors, and that changes in implementation details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

What is claimed is:

1. A method for forming a plurality of transistors having different threshold voltages, the method comprising the steps of:

a) providing a semiconductor substrate;

b) forming a plurality of shapes on the semiconductor substrate, each of the plurality of shapes having a width;

c) selectively adjusting the widths of at least one selected shapes;

d) patterning the semiconductor substrate using the plurality of shapes to form a plurality of transistor bodies such that the width of each the plurality of transistor bodies is at least partially determined by the width of a corresponding one of the plurality of shapes;

e) providing a first gate structure of a first work-function adjacent a first body edge of each of the plurality of transistor bodies; and f) providing a second gate structure of a second work-function adjacent a second body edge of each of the plurality of transistor bodies.

2. The method of claim 1 wherein the first gate structure of a first work-function comprises p-type material and wherein the second gate structure of a second work-function comprises n-type material.

3. The method of claim 1 further comprising (g) forming source, drain, and halo regions utilizing angled implantation.

4. The method of claim 1 wherein the semiconductor substrate comprises a silicon-on-insulator layer, and wherein the step of patterning the semiconductor substrate using the plurality of shapes to form a plurality of transistor bodies comprises patterning the silicon-on-insulator layer.

5. The method of claim 3, wherein said substrate has a horizontal plane, and wherein source and drain regions are formed therein at an angle between approximately 70° and 83° with respect to said horizontal plane.

6. The method of claim 1 wherein the step of forming a plurality of shapes and the step of patterning the semiconductor substrate using the plurality of shapes to form a plurality of transistor bodies comprises: forming a mandrel layer on the semiconductor substrate; patterning the mandrel layer to form an exposed side, and forming a sidewall spacer adjacent to the exposed side, and wherein a first edge of the sidewall spacer defines the first body edge and a second edge of the sidewall spacer defines the second body edge.

7. The method of claim 1 wherein the step of forming a plurality of shapes and the step of patterning the semiconductor substrate using the plurality of shapes to form a plurality of transistor bodies comprises forming a mandrel layer on the semiconductor substrate, patterning the mandrel layer, and using the patterned mandrel layer to define the first body edge, forming a sidewall spacer adjacent to a gate material layer and using the sidewall spacer to define the second body edge.

8. A method for forming a plurality of field effect transistors having different threshold voltages, the method comprising the steps of:

a) providing a silicon-on-insulator substrate, the silicon-on-insulator substrate comprising a silicon layer on a buried dielectric layer;

b) forming a mandrel layer on the silicon layer; patterning the mandrel layer to define a plurality of mandrel layer edges;

c) patterning the silicon layer with the plurality of mandrel layer edges, the patterning of the silicon layer providing a plurality of first body edges;

d) forming a plurality of first gate dielectrics on the plurality of first body edges;

e) providing a plurality of first gate structures of a first work-function adjacent the first body edges on the plurality of first gate dielectrics;

f) patterning the mandrel layer to expose a first edges of the plurality of first gate structures;

g) forming a plurality of sidewall spacers adjacent the first edges of the plurality of first gate structures, the sidewall spacers having a sidewall spacer width;

h) adjusting the width of selected sidewall spacers;

i) patterning the silicon layer with plurality of sidewall spacers, the pattering of the silicon layer providing a plurality of second body edges, where the first and second body edges of the patterned silicon layer define a plurality of transistor bodies;

j) providing a plurality of second gate dielectrics on the plurality of second body edges; and k) providing a plurality of second gate structures of a second work-function adjacent the second body edges on the plurality of second gate dielectrics.

9. The method of claim 8 wherein the plurality of first gate structures of a first work-function comprises p-type polysilicon material and wherein the plurality of second gate structures of a second work-function comprises n-type polysilicon material.

10. The method of claim 8 wherein the plurality of first gate structures of a first work-function comprises n-type polysilicon material and wherein the plurality of second gate structures of a second work-function comprises p-type polysilicon material.

11. The method of claim 8 further comprising the step of forming a plurality of source/drain implants into the bodies of the transistors by performing an angled implant into the transistor bodies.

* * * * *